United States Patent
Bibl et al.

(10) Patent No.: US 10,147,711 B2
(45) Date of Patent: *Dec. 4, 2018

(54) DISPLAY MODULE AND SYSTEM APPLICATIONS

(71) Applicant: Apple Inc., Cupertino, CA (US)

(72) Inventors: Andreas Bibl, Los Altos, CA (US); Kapil V. Sakariya, Los Altos, CA (US); Vikram Pavate, Foster City, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/908,505

(22) Filed: Feb. 28, 2018

(65) Prior Publication Data

US 2018/0190632 A1 Jul. 5, 2018

Related U.S. Application Data

(63) Continuation of application No. 15/417,015, filed on Jan. 26, 2017, now Pat. No. 9,922,966, which is a (Continued)

(51) Int. Cl.
*G06F 3/042* (2006.01)
*H01L 25/16* (2006.01)
(Continued)

(52) U.S. Cl.
CPC ............. *H01L 25/167* (2013.01); *G04G 9/10* (2013.01); *G06F 1/163* (2013.01); *G06F 1/1652* (2013.01);
(Continued)

(58) Field of Classification Search
CPC ........ G06F 3/0412; G06F 3/041; G06F 3/042; G06F 3/044; G09G 3/30; G09G 3/32
See application file for complete search history.

(56) References Cited

U.S. PATENT DOCUMENTS 3,717,743 A 2/1973 Costello
3,935,986 A 2/1976 Lattari et al.
(Continued)

FOREIGN PATENT DOCUMENTS

CN 1747668 A 3/2006
CN 101640712 A 2/2010
(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.
(Continued)

*Primary Examiner* — Vijay Shankar
(74) *Attorney, Agent, or Firm* — Jaffery Watson Mendonsa & Hamilton LLC

(57) ABSTRACT

A display module and system applications including a display module are described. The display module may include a display substrate including a front surface, a back surface, and a display area on the front surface. A plurality of interconnects extend through the display substrate from the front surface to the back surface. An array of light emitting diodes (LEDs) are in the display area and electrically connected with the plurality of interconnects, and one or more driver circuits are on the back surface of the display substrate. Exemplary system applications include wearable, rollable, and foldable displays.

18 Claims, 16 Drawing Sheets

Related U.S. Application Data continuation of application No. 15/157,235, filed on May 17, 2016, now Pat. No. 9,582,036, which is a continuation of application No. 14/109,864, filed on Dec. 17, 2013, now Pat. No. 9,367,094.

(51) Int. Cl.

| | | |
|---|---|---|
| *G06F 3/041* | (2006.01) | |
| *G06F 1/16* | (2006.01) | |
| *G09G 3/32* | (2016.01) | |
| *H01L 25/075* | (2006.01) | |
| *G04G 9/10* | (2006.01) | |
| *H01L 23/29* | (2006.01) | |
| *H01L 23/31* | (2006.01) | |
| *H01L 23/538* | (2006.01) | |
| *H01L 31/0216* | (2014.01) | |
| *H01L 31/16* | (2006.01) | |
| *H01L 33/44* | (2010.01) | |
| *H01L 33/62* | (2010.01) | |
| *H05K 1/11* | (2006.01) | |
| *H05K 1/18* | (2006.01) | |
| *H05K 1/14* | (2006.01) | |
| *G06F 3/14* | (2006.01) | |

(52) U.S. Cl.
CPC ............ *G06F 3/042* (2013.01); *G06F 3/0412* (2013.01); *G09G 3/32* (2013.01); *H01L 23/293* (2013.01); *H01L 23/3171* (2013.01); *H01L 23/5384* (2013.01); *H01L 23/5386* (2013.01); *H01L 23/5387* (2013.01); *H01L 25/0753* (2013.01); *H01L 31/0216* (2013.01); *H01L 31/16* (2013.01); *H01L 33/44* (2013.01); *H01L 33/62* (2013.01); *G06F 3/14* (2013.01); *G09G 2380/02* (2013.01); *H01L 2924/0002* (2013.01); *H05K 1/115* (2013.01); *H05K 1/147* (2013.01); *H05K 1/189* (2013.01); *H05K 2201/10106* (2013.01); *H05K 2201/10128* (2013.01)

(56) References Cited

U.S. PATENT DOCUMENTS

| | | |
|---|---|---|
| 5,131,582 A | 7/1992 | Kaplan et al. |
| 5,378,926 A | 1/1995 | Chi et al. |
| 5,435,857 A | 7/1995 | Han et al. |
| 5,592,358 A | 1/1997 | Shamouilian et al. |
| 5,740,956 A | 4/1998 | Seo et al. |
| 5,794,839 A | 8/1998 | Kimura et al. |
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,080,650 A | 6/2000 | Edwards |
| 6,081,414 A | 6/2000 | Flanigan et al. |
| 6,335,263 B1 | 1/2002 | Cheung et al. |
| 6,403,985 B1 | 6/2002 | Fan et al. |
| 6,420,242 B1 | 7/2002 | Cheung et al. |
| 6,521,511 B1 | 2/2003 | Inoue et al. |
| 6,558,109 B2 | 5/2003 | Gibbel |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,683,368 B1 | 1/2004 | Mostafazadeh |
| 6,786,390 B2 | 9/2004 | Yang et al. |
| 6,878,607 B2 | 4/2005 | Inoue et al. |
| 6,918,530 B2 | 7/2005 | Shinkai et al. |
| 7,033,842 B2 | 4/2006 | Haji et al. |
| 7,148,127 B2 | 12/2006 | Oohata et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,439,549 B2 | 10/2008 | Marchl et al. |
| 7,585,703 B2 | 9/2009 | Matsumura et al. |
| 7,628,309 B1 | 12/2009 | Erikssen et al. |
| 7,667,962 B2 | 2/2010 | Mullen |
| 7,714,336 B2 | 5/2010 | Imai |
| 7,723,764 B2 | 5/2010 | Oohata et al. |
| 7,795,629 B2 | 9/2010 | Watanabe et al. |
| 7,797,820 B2 | 9/2010 | Shida et al. |
| 7,838,410 B2 | 11/2010 | Hirao et al. |
| 7,854,365 B2 | 12/2010 | Li et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,972,875 B2 | 7/2011 | Rogers et al. |
| 7,989,266 B2 | 8/2011 | Borthakur et al. |
| 7,999,454 B2 | 8/2011 | Winters et al. |
| 8,023,248 B2 | 9/2011 | Yonekura et al. |
| 8,076,670 B2 | 12/2011 | Slater et al. |
| 8,082,003 B2 | 12/2011 | Jee |
| 8,186,568 B2 | 5/2012 | Coronel et al. |
| 8,333,860 B1 | 12/2012 | Bibl et al. |
| 8,349,116 B1 | 1/2013 | Bibl et al. |
| 8,426,227 B1 | 4/2013 | Bibl et al. |
| 8,518,204 B2 | 8/2013 | Hu et al. |
| 8,814,754 B2 | 8/2014 | Weast et al. |
| 9,367,094 B2 | 6/2016 | Bibl et al. |
| 9,582,036 B2 * | 2/2017 | Bibl .................... G06F 3/0412 |
| 9,922,966 B2 * | 3/2018 | Bibl .................... H01L 25/167 |
| 2001/0029088 A1 | 10/2001 | Odajima et al. |
| 2002/0076848 A1 | 6/2002 | Spooner et al. |
| 2003/0010975 A1 | 1/2003 | Gibb et al. |
| 2003/0177633 A1 | 9/2003 | Haji et al. |
| 2004/0100164 A1 | 5/2004 | Murata et al. |
| 2004/0232439 A1 | 11/2004 | Gibb et al. |
| 2004/0266048 A1 | 12/2004 | Platt et al. |
| 2005/0224822 A1 | 10/2005 | Liu |
| 2005/0232728 A1 | 10/2005 | Rice et al. |
| 2006/0038291 A1 | 2/2006 | Chung et al. |
| 2006/0055035 A1 | 3/2006 | Lin et al. |
| 2006/0061555 A1 | 3/2006 | Mullen |
| 2006/0065905 A1 | 3/2006 | Eisert et al. |
| 2006/0146514 A1 | 7/2006 | Douglas |
| 2006/0157721 A1 | 7/2006 | Tran et al. |
| 2006/0160276 A1 | 7/2006 | Brown et al. |
| 2006/0214299 A1 | 9/2006 | Fairchild et al. |
| 2007/0048902 A1 | 3/2007 | Hiatt et al. |
| 2007/0166851 A1 | 7/2007 | Tran et al. |
| 2007/0194330 A1 | 8/2007 | Ibbetson et al. |
| 2008/0048206 A1 | 2/2008 | Lee et al. |
| 2008/0150134 A1 | 6/2008 | Shinkai et al. |
| 2008/0163481 A1 | 7/2008 | Shida et al. |
| 2008/0194054 A1 | 8/2008 | Lin et al. |
| 2008/0196237 A1 | 8/2008 | Shinya et al. |
| 2008/0205027 A1 | 8/2008 | Coronel et al. |
| 2008/0283190 A1 | 11/2008 | Papworth et al. |
| 2008/0283849 A1 | 11/2008 | Imai |
| 2008/0303038 A1 | 12/2008 | Grotsch et al. |
| 2009/0068774 A1 | 3/2009 | Slater et al. |
| 2009/0072382 A1 | 3/2009 | Guzek |
| 2009/0146303 A1 | 6/2009 | Kwon |
| 2009/0303713 A1 | 12/2009 | Chang et al. |
| 2009/0314991 A1 | 12/2009 | Cho et al. |
| 2010/0052004 A1 | 3/2010 | Slater et al. |
| 2010/0105172 A1 | 4/2010 | Li et al. |
| 2010/0123164 A1 | 5/2010 | Suehiro et al. |
| 2010/0176415 A1 | 7/2010 | Lee et al. |
| 2010/0188794 A1 | 7/2010 | Park et al. |
| 2010/0200884 A1 | 8/2010 | Lee et al. |
| 2010/0203659 A1 | 8/2010 | Akaike et al. |
| 2010/0203661 A1 | 8/2010 | Hodota |
| 2010/0213471 A1 | 8/2010 | Fukasawa et al. |
| 2010/0214777 A1 | 8/2010 | Suehiro et al. |

(56) References Cited

U.S. PATENT DOCUMENTS

| | | |
|---|---|---|
| 2010/0248484 A1 | 9/2010 | Bower et al. |
| 2010/0276726 A1 | 11/2010 | Cho et al. |
| 2011/0003410 A1 | 1/2011 | Tsay et al. |
| 2011/0049540 A1 | 3/2011 | Wang et al. |
| 2011/0132655 A1 | 6/2011 | Horiguchi et al. |
| 2011/0132656 A1 | 6/2011 | Horiguchi et al. |
| 2011/0143467 A1 | 6/2011 | Xiong et al. |
| 2011/0147760 A1 | 6/2011 | Ogihara et al. |
| 2011/0151602 A1 | 6/2011 | Speier |
| 2011/0159615 A1 | 6/2011 | Lai |
| 2011/0210357 A1 | 9/2011 | Kaiser et al. |
| 2011/0291134 A1 | 12/2011 | Kang |
| 2011/0297914 A1 | 12/2011 | Zheng et al. |
| 2011/0312131 A1 | 12/2011 | Renavikar et al. |
| 2012/0018494 A1 | 1/2012 | Jang et al. |
| 2012/0064642 A1 | 3/2012 | Huang et al. |
| 2012/0134065 A1 | 5/2012 | Furuya et al. |
| 2012/0253485 A1 | 10/2012 | Weast et al. |
| 2012/0256814 A1 | 10/2012 | Ootorii |
| 2012/0314383 A1 | 12/2012 | Oohira |
| 2013/0019996 A1 | 1/2013 | Routledge |
| 2013/0038416 A1 | 2/2013 | Arai et al. |
| 2013/0044215 A1 | 2/2013 | Rothkopf et al. |
| 2013/0130440 A1 | 5/2013 | Hu et al. |
| 2013/0134591 A1 | 5/2013 | Sakamoto et al. |
| 2013/0161682 A1 | 6/2013 | Liang et al. |
| 2013/0285921 A1 | 10/2013 | Alberth, Jr. et al. |

FOREIGN PATENT DOCUMENTS

| | | |
|---|---|---|
| CN | 102446948 A | 5/2012 |
| CN | 103227276 A | 7/2013 |
| EP | 2 150 031 A1 | 2/2010 |
| EP | 2 650 935 A2 | 10/2013 |
| JP | H03-160767 A | 7/1991 |
| JP | H05-64208 A | 3/1993 |
| JP | 07-060675 A | 3/1995 |
| JP | 11-142878 | 5/1999 |
| JP | 2001-154613 | 6/2001 |
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2003-308028 | 10/2003 |
| JP | 2004-095944 A | 3/2004 |
| JP | 2007-73752 | 3/2007 |
| JP | 2007-74666 | 3/2007 |
| JP | 2008-200821 A | 9/2008 |
| JP | 2010-056458 A | 3/2010 |
| JP | 2010-161212 A | 7/2010 |
| JP | 2010-186829 A | 8/2010 |
| JP | 2011-181834 A | 9/2011 |
| JP | 2012-227514 | 11/2012 |
| KR | 10-0610632 B1 | 8/2006 |
| KR | 10-2007-0042214 A | 4/2007 |
| KR | 10-2007-0093091 A | 9/2007 |
| KR | 10-0973928 B1 | 8/2010 |
| KR | 10-1001454 B1 | 12/2010 |
| KR | 10-2007-0006885 A | 1/2011 |
| KR | 10-2011-0084888 A | 7/2011 |
| TW | M403720 | 5/2011 |
| TW | 201231860 A | 8/2012 |
| WO | WO 2005-099310 A2 | 10/2005 |
| WO | WO 2011/123285 | 10/2011 |

OTHER PUBLICATIONS

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID '06, Oct. 8-12, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Proceedings of CARTS Europe, Barcelona, Spain, 2007, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low-Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

"COF (Chip on Film)" Samsung Semiconductor Global Website. http://www.samsung.com/global/business/semiconductor/support/package-info/package-datasheet/various-packages/cof. Web. Nov. 14, 2013. 3 pages.

"COG (Chip on Glass)" Samsung Semiconductor Global Website. http://www.samsung.com/global/business/semiconductor/support/package-info/package-datasheet/various-packages/cog. Web. Nov. 14, 2013. 3 pages.

"Chip-On-Glass technology for a simpler, and less expensive LCD display solution" NXP Semiconductors N.V. Document No. 9397 750 17282. Date of release May 2012. 2 pages. http://www.nxp.com/documents/leaflet/75017282.pdf.

Johnson, Luke, "Apple job listing hunts for 'flexible display' engineer, iPhone 6 and iWatch mooted," Trusted Reviews. Apr. 11, 2013, 2 pgs. http://www.trustedreviews.com/news/apple-job-listing-hunts-for-flexible-display-engineer-iphone-6-and-iwatch-mooted. Web. Feb. 3, 2014.

"Samsung flexible display patents include pull-out and rollable concept units," posted Mar. 12, 2007 by Daniel P. 1 pg. http://www.phonearena.com/news/Samsung-flexible-display-patents-include-pull-out-and-rollable-concept-units_id27765. Web. Feb. 3, 2014.

"Samsung's Killer SmartPhone Continues to Advance," Patent Bolt, Jun. 18, 2012. 10 pages. http://www.patentbolt.com/2012/06/samsungs-killer-smartphone-continues-to-advance.html. Web. Nov. 12, 2013.

Smith, Chris, "Samsung tablet with flexible display spotted in new design patent," Android Authority. May 19, 2013. 3 pgs. http://www.androidauthority.com/samsung-tablet-flexible-display-spotted-new-design-patent-212624/. Web. Feb. 3, 2014.

Williams, Storm, "Here Comes Apple iWatch Patent—Bi-Stable Spring With Flexible Display (20130044215)," The Tech Storm, posted Feb. 21, 2013, 3 pgs. http://www.thetechstorm.com/2013/

(56) References Cited

OTHER PUBLICATIONS

02/here-comes-apple-iwatch-patent-bi-stable-spring-with-flexible-display-20130044215/. Web. Feb. 3, 2014.
PCT International Search Report and Written Opinion for International Application No. PCT/US2014/067190, dated Jul. 29, 2015, 15 pages.
Takahashi, et al., "High density LED display panel on silicon microreflector and integrated circuit," Electronic Manufacturing Technology Symposium, 1995, Proceedings of 1995 Japan International, 18th IEEE/CPMT International, pp. 271-275.
PCT International Preliminary Report of Patentability for International Application No. PCT/US2014/067190, dated Jun. 30, 2016, 9 pages.

* cited by examiner

DISPLAY MODULE AND SYSTEM APPLICATIONS

RELATED APPLICATIONS

This application is a continuation of co-pending U.S. patent application Ser. No. 15/417,015, filed Jan. 26, 2017, which is a continuation of U.S. patent application Ser. No. 15/157,235, filed May 17, 2016, now U.S. Pat. No. 9,582,036, which is a continuation of U.S. patent application Ser. No. 14/109,864, filed on Dec. 17, 2013, now U.S. Pat. No. 9,367,094 which is incorporated herein by reference.

BACKGROUND

Field

The present invention relates to display modules. More particularly embodiments of the present invention relate to display module packages and system applications thereof.

Background Information

Light emitting diodes (LEDs) are increasingly being considered as a replacement technology for existing light sources. For example, LEDs are found in signage, traffic signals, automotive tail lights, mobile electronic displays, and televisions. Some specific mobile electronics are smart electronic devices, such as smartphones, smartwatches, etc. including more advanced computing capability than a feature phone or watch. Demand is increasing for thinner, lighter weight, and lower cost smart electronic devices, with higher resolution and larger touch screens. Organic light emitting diode (OLED) display and liquid crystal display (LCD) are the two most widely adopted display technologies in current smart electronic devices.

OLED technology generally includes a layer of an organic compound in a pixel area, and a thin film transistor (TFT) backplane to switch each individual pixel on or off. An OLED display works without a backlight and can display deep black levels. The organic compound layer is sensitive to air and moisture, which can lead to degradation of the display. OLED displays are typically encapsulated with a rigid glass cover to protect the organic compound from air and moisture.

LCD technology generally includes pixels filled with liquid crystals, and a thin film transistor (TFT) backplane to switch each individual pixel on or off. Since the liquid crystals do not produce light by themselves, they need backlight illumination from behind or side of the display panel.

Two widely adopted manners for packaging display modules based on OLED or LCD include chip-on-glass (COG) packaging and chip-on-film (COF) packaging. FIGS. 1A-1B are exemplary schematic cross-sectional side view and schematic front view illustrations of a COG packaged display module. As illustrated, the display module 100 includes a display panel 115 connected to a printed circuit board (PCB) 106 by a flexible printed circuit (FPC) 108. The display panel 115 includes a display substrate 102 formed of either OLED or LCD display technologies, one or more driver ICs 110 mounted on the display substrate 102 and a cover 114 over the display substrate. A seal ring 113 may surround the display area 101 of the display substrate for attaching the cover 114 and sealing the display area 101 from air and moisture. In smart electronic devices the display substrate 102 may additionally include a touch screen within the display area 101. Alternatively a touch screen can be formed over the display substrate 102. In the case of LCD display technology, a backlight 105 is located behind the display substrate.

Additional devices and IC chips 104 for operating the display module 100 are located off of the display substrate 102 on PCB 106. For example, IC chips 104 can include a power management IC, processor, timing controller, touch sense IC, wireless controller, communications IC, etc. As illustrated, the PCB 106 is connected to the display substrate 102 with FPC 108, with contact areas 107 of the FPC 108 bonded to surfaces of the display substrate 102 and PCB 106. Referring to both FIGS. 1A-1B, the area reserved on the display substrate for the one or more driver ICs 110 and contact area 107 are referred to as a contact ledge 111. The PCB 106 may extend laterally from the display substrate 102, or alternatively can be wrapped behind the display substrate as illustrated. As shown in FIGS. 1A-1B, a lateral extension length 109 of the FPC 108 may be associated with the FPC 108 of the display module, even where the PCB 106 is wrapped behind the display substrate 102. A battery 112 may also be located behind the display substrate with the PCB 106.

COF packaging is similar to COG packaging, with one main difference being that the one or more driving ICs 110 are moved from the display substrate 102 onto the FPC 108. In such applications, the contact ledge may require less space than COG packaging.

SUMMARY OF THE INVENTION

Display module packages and system applications thereof are described. In an embodiment, a display module includes a display substrate having a front surface, a back surface, and a display area on the front surface. A plurality of interconnects extend through the display substrate from the front surface to the back surface, and an array of LEDs are in the display area and electrically connected with the plurality of interconnects. One or more driver circuits are on the front surface or the back surface of the display substrate. In an embodiment, the plurality of interconnects extend through the display substrate from the front surface to the back surface directly behind the display area, and the one or more driver circuits are on the back surface of the display substrate. In an embodiment, a flexible printed circuit does not connect the one or more driver circuits to the display substrate.

The plurality of interconnects may be through vias that extend through the display substrate from the front surface to the back surface. The interconnects can be used for a variety of applications, for example, a ground via. A variety of devices can be located on the front or back surfaces of the display substrate. For example, a battery can be located on a back surface of the display substrate. In an embodiment, an array of micro chips are located on the front surface of the display substrate and within the display area. The array of micro chips may be electrically connected with the plurality of interconnects and the array of LEDs. In some embodiments, the array of micro chips overlaps the plurality of interconnects. In other embodiments, the array of micro chips do not overlap the plurality of interconnects. In an embodiment, the array of micro chips includes an array of ambient light sensors. A uniform distribution of ambient light sensors can be located in the array of micro chips.

In accordance with embodiments of the invention the display module can be incorporated into a wearable electronic device, for example, a smartwatch. In such an embodiment, the display area of the display substrate spans a watch face and a band of the smartwatch. In another embodiment, the display substrate is secured to a spool. In such an embodiment, the spool can include the one or more driver circuits in electrical contact with the plurality of interconnects. In one applications, the display module can be incorporated into a television.

In an embodiment, a non-transitory computer-readable medium stores instructions which, when executed by a processor, cause the processor to perform operations to adjust display data for a display area of a wearable electronic device. The operations include receiving input form a control device, with the input including data for the display area of the wearable electronic device. The input is parsed to derive the data for display, and the derived data is displayed on the display area, where the display area is on a flexible display substrate spanning a face and band of the wearable electronic device. For example, the wearable electronic device may be a smartwatch. In an embodiment, the non-transitory computer-readable medium stores additional instructions to perform additional operations including receiving a configuration of the display area of the watch face and band, receiving a design from the derived data, the design including a watch face and watch band, and updating the display area with the received design.

In an embodiment, a display module for a wearable electronic device includes a flexible display substrate spanning a face and a band of the wearable electronic device. An accessory manager is coupled to the display substrate, to receive input form a control device communicatively coupled to the display module. The display module additionally includes a graphical user interface (GUI) manager, to control information displayed on the display substrate, where the display substrate includes a first display area associated with a face of the wearable electronic device and a second display area associated with a band of the wearable electronic device. In an embodiment, the GUI manager is to further provide a watch face design to the first display area and a watch band design to the second display area. In an embodiment, the accessory manager is to further receive input data from a control device via a communication module, the input data including configuration data for the GUI manager.

DETAILED DESCRIPTION OF THE INVENTION

Figure 1A:
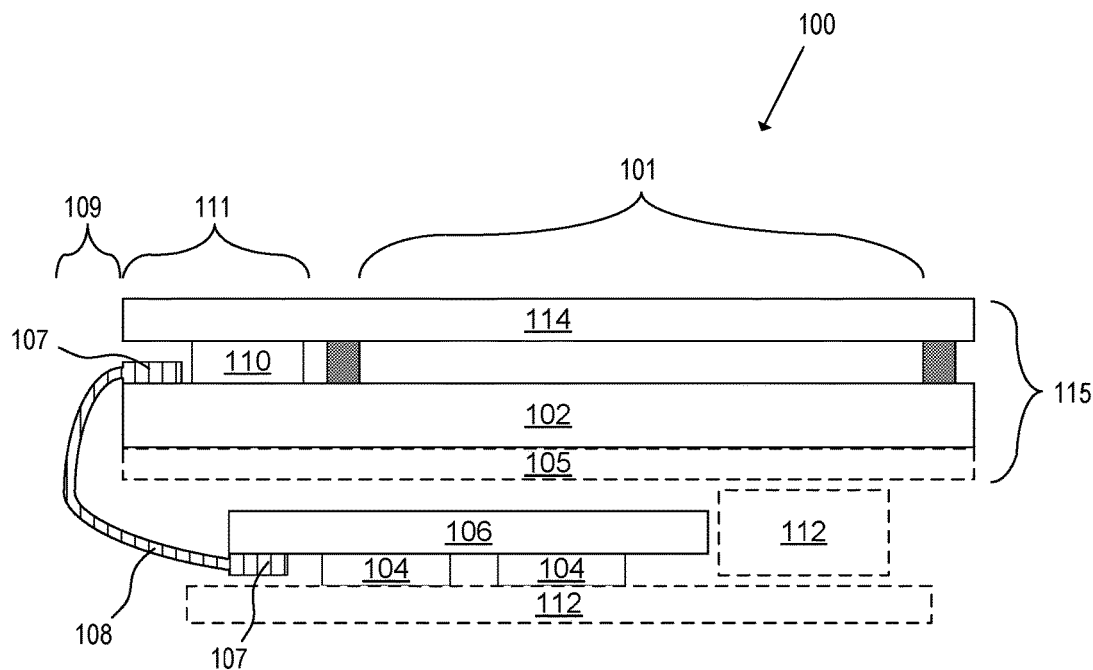
FIG. 1A is a schematic cross-sectional side view illustration of a COG packaged display module.
Figure 1B:
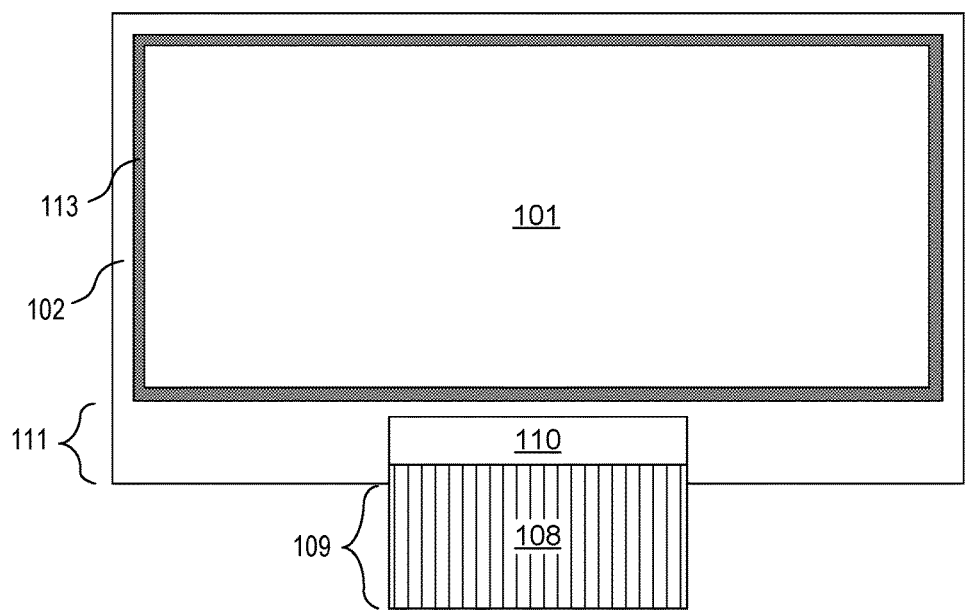
FIG. 1B is a schematic front view illustration of a COG packaged display module.

Embodiments of the present invention describe display module packaging configurations and system applications thereof. In an embodiment, a display module includes a display panel which includes a display substrate with a front surface, a back surface, and a display area on the front surface. A plurality of interconnects extend through the display substrate from the front surface to the back surface, and are electrically connected with an array of LEDs are on the front surface of the display substrate. For example, each interconnect may be a single through via, or a series of interconnect lines and vias through multiple layers. One or more driver circuits are located on the front or back surfaces of display substrate and in electrical connection with the plurality of interconnects. In an embodiment the one or more driver circuits are located on the back surface of the display substrate. In an embodiment, the one or more driver circuits are located on the back surface of the display substrate directly behind the display area on the front surface of the display substrate.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment" means that a particular feature, structure, configuration, or characteristic described in connection with the embodiment is included in at least one embodiment of the invention. Thus, the appearances of the phrase "in one embodiment" in various places throughout this specification are not necessarily referring to the same embodiment of the invention. Furthermore, the particular features, structures, configurations, or characteristics may be combined in any suitable manner in one or more embodiments.

The terms "spanning", "over", "to", "between" and "on" as used herein may refer to a relative position of one layer with respect to other layers. One layer "spanning", "over" or "on" another layer or bonded "to" or in "contact" with another layer may be directly in contact with the other layer or may have one or more intervening layers. One layer "between" layers may be directly in contact with the layers or may have one or more intervening layers.

In one aspect, embodiments of the invention enable the fabrication of display panels and display modules with a reduced form factor in the x-y and z directions compared to COG and COF display module packaging configurations. In an embodiment, the x-y and z form factors are reduced compared to COG and COF display module packaging configurations by connecting the one or more driver circuits to interconnects, for example through vias, extending through the display substrate from the front surface to the back surface rather than with a FPC. Furthermore, the packaging approaches in accordance with embodiments of the invention may improve system performance due to shorter interconnects between components.

In an embodiment, the x-y form factor (e.g. length-width) is reduced compared to COG and COF display module packaging configurations by removing or reducing the contact ledge area that would otherwise be reserved for one or more driver ICs 110 on the display area side of the display substrate, contact area of the FPC to the display substrate, and/or the lateral extension length associated with the FPC when positioned lateral to the display substrate 102 or wrapped around and below the display substrate. In accordance with embodiments of the invention, such a reduction of the x-y form factor may also allow for an increased allocation of display area on the display substrate. For example, COG packaging may require a contact ledge of at least 4-5 mm to allocate the driver ICs and FPC contact area. In accordance with embodiments of the invention, it is not required to allocate space for driver ICs and a FPC. In this manner a bevel width around the display area can be reduced below 1 mm, for example less than 0.5 mm.

In an embodiment, the z form factor (e.g. thickness) is reduced compared to COG and COF display module packaging configurations by removing the FPC and PCB. In accordance with embodiments of the invention, a plurality of interconnects, for example though vias, extend through the display substrate from the front surface to the back surface to connect the driver ICs and any additional IC chips including a power management IC, processor, timing controller, touch sense IC, wireless controller, communications IC, etc. In this manner, the chips and circuits for operating the display panel and module can be located on the back surface of the display substrate, eliminating the thickness of a PCB. In many embodiments, the driver ICs and additional IC chips are located directly behind the display area.

In some embodiments, the display panel includes a plurality of semiconductor-based LEDs in the display area. Such a configuration may enable the use of interconnects or through vias that otherwise may be problematic with the widely adopted LCD or OLED display technologies. For example, through vias and the placement of ICs on the back surface of the display substrate could be particularly problematic with conventional LCD technology which includes liquid crystals in the display area and requires the use of backlighting. Through vias could also be particularly problematic with existing OLED display technologies where through vias could potentially lead to air or moisture exposure. Though it is to be appreciated that some embodiments of the invention may be compatible with OLED display technology.

In another aspect, embodiments of the invention describe packaging configurations of flexible display panels into flexible display modules that can be incorporated into a variety of applications. In one application, embodiments of the invention describe a wearable electronic device, such as a smartwatch, including a flexible display panel and flexible display module. In this manner, the display area of the smartwatch is not limited to a rigid watch face area. In an embodiment, a smartwatch includes a flexible display panel that is integrated into a flexible watch band. Accordingly, curvature of the flexible display panel in both the watch face area and band may be adjusted to conform to the wrist size of the user. In addition, it is not required to include a FPC attached to the display area side of the display substrate. In this manner, the display area of the flexible display panel can cover more available space on the watch face area and band of the smartwatch.

The wearable electronic device may include a non-transitory computer readable medium including computer code for receiving a user input from a control device and adjusting display data for the display area of the wearable electronic device. For example, in one application, the user may select a specific watch design to be displayed on the display panel of the smartwatch spanning a watch face and band of the smartwatch. Upon receiving the user input from a control device such as a computer, or portable electronic device such as a smartphone, the display data for the display area of the wearable electronic device is adjusted.

In another application, the flexible display panel is rollable. For example, the display panel may be incorporated into a television display that is rollable or foldable into and out of a housing. In an embodiment, the flexible television display panel is coupled to a spool onto which the display panel is rollable or foldable. In an embodiment, the driver ICs and/or any additional IC chips including a power management IC, processor, timing controller, touch sense IC, wireless controller, communications IC, etc. can be relocated to the spool and electrically connected with the flexible television display panel with a redistribution layer on the back surface of the flexible television display panel. The driver ICs and any additional IC chips can alternatively be located on the back surface of the display panel. In another application, the flexible display panel is foldable. For example, the display panel may be incorporated into a smartphone or tablet and folded into various configurations.

Figure 2A:
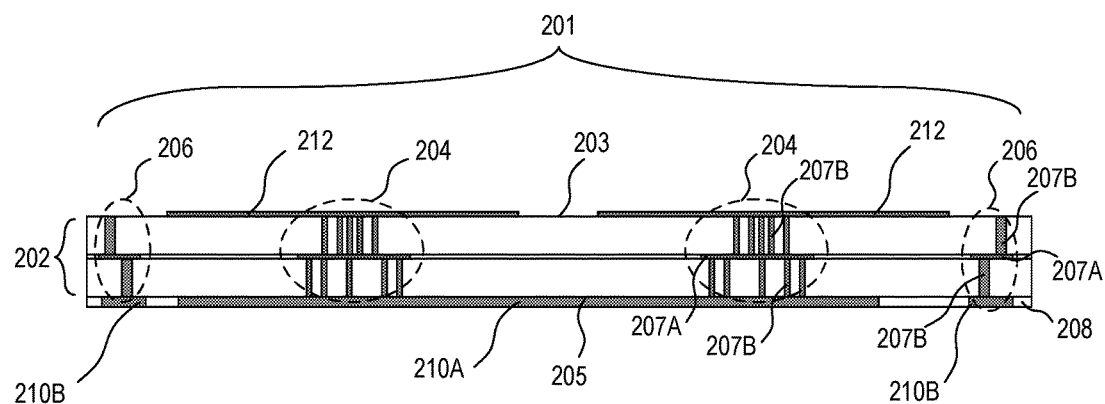
FIG. 2A is a schematic cross-sectional side view illustration of a display substrate including a plurality of interconnects in accordance with an embodiment of the invention.
Figure 2B:
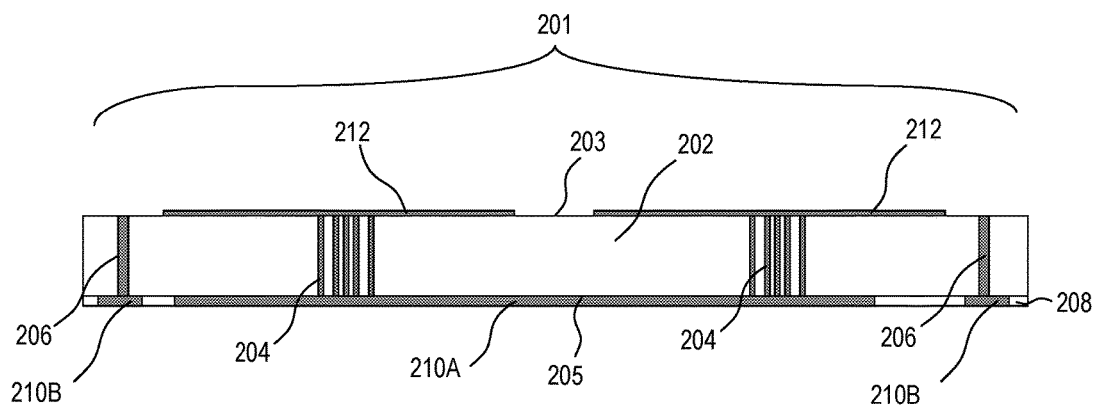
FIG. 2B is a schematic cross-sectional side view illustration of a display substrate including a plurality of through vias in accordance with an embodiment of the invention.

FIG. 2A is a schematic cross-sectional side view illustration of a display substrate including a plurality of interconnects in accordance with an embodiment of the invention. As illustrated, the display substrate 202 may include a front surface 203, a back surface 205, and a display area 201 on the front surface. A plurality of interconnects 204, 206 extend through the display substrate from the front surface 203 to the back surface 205 directly behind the display area 201. As illustrated, each interconnect 204, 206 may be a series of interconnect lines 207A and vias 207B through multiple layers of a multi-layer display substrate 202. Referring to FIG. 2B, each interconnect 204, 206 may be a single through via formed through the display substrate 202, which may be a single or multi-layer display substrate 202. In interest of conciseness, the flowing description and figures refer to interconnect features 204, 206 as through vias. It is to be appreciated however, that such a configuration references an embodiment, and that when referring to through vias 204, 206, these may be replaced by interconnects including a series of interconnect lines and vias through multiple layers of a multi-layer display substrate. Through vias 204, 206 may be formed using a variety of techniques including, but not limited to, chemical etching or laser drilling.

Display substrate 202 can be formed from a variety of materials including glass, amorphous silicon, polysilicon, single crystal silicon, metal foil, metal foil covered with dielectric, or a polymer such as poly(methyl methacrylate) (PMMA), polyethylene terephthalate (PET), polyethelyne naphthalate (PEN), polycarbonate (PC), polyethersulphone (PES), aromatic fluorine-containing polyarylates (PAR), polycyclic olefin (PCO), and polyimide (PI). In an embodiment, display substrate includes a polymer-silicon stack. In an embodiment, display substrate 202 is a flexible glass substrate. For example, display substrate 202 may be a flexible boro-silicate glass substrate. One exemplary flexible glass substrate is manufactured under the tradename WILLOW™ glass by Corning Incorporated located in Corning, N.Y.

In the embodiments illustrated, a redistribution layer 208 is formed on the back surface 205 of the display substrate. Redistribution layer may include a single layer or a plurality of layers including wiring 210A, 210B. For example, wiring 210A can be used to for electrical contact with an array of LEDs formed on the top surface 203 of the display substrate 202 with one or more through vias 204, while wiring 210B may be used for a Vss connection with one or more through vias 206. In an embodiment, the one or more through vias 204, 206 are directly behind the display area 201. The one or more through vias 204, 206 may also be located outside of the display are 201, such as along a periphery of the display area 201 on the top surface 203 of display substrate 202.

Figure 3:
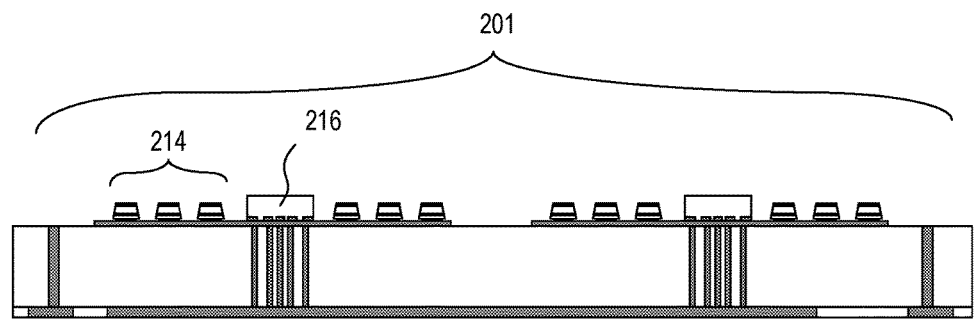
FIG. 3 is a schematic cross-sectional side view illustration of a display substrate including an array of LEDs and micro chips in a display area on a front surface of the display substrate in accordance with an embodiment of the invention.

A wiring layer 212 may also be located on the top surface 203 of display substrate 202 in electrical contact with the plurality of through vias 204. Wiring layers 212, 210A, 210B and vias 204, 206 may be formed of any suitable electrically conductive material used in packaging applications including metals films, conductive polymers, conductive oxides, etc. Referring now to FIG. 3, in accordance with an embodiment of the invention and array of LED devices 214 and optionally micro chips 216 may be transferred and bonded to the display substrate 202. For example, the array of LED devices 214 and micro chips 216 may be in electrical connection with the plurality of through vias 204.

In accordance with embodiments of the invention, the LED devices 214 are semiconductor-based LED devices including one or more active layers (e.g. quantum well layers) between two doped semiconductor cladding layers. In the particular embodiments illustrated, the LED devices 214 are vertical LED devices in which the layers are horizontal, and the layers are stacked vertically. Top and bottom conductive contacts are formed on the vertical LED devices in order to make electrical contact with the top contact layers 220 described in further detail with regard to FIG. 4 below and wiring layer 212, respectively. In another embodiment, the LED devices 214 are horizontal LED devices in which the contacts to the doped cladding layers are both formed on the bottom surface of an LED device in order to make electrical contact with wiring layer 212.

In accordance with embodiments of the invention, the micro chips 216 replace the TFT layer of a conventional active matrix display to switch and drive one or more LED devices 214. In one embodiment, each micro chip 216 couples with one or more red, green, and blue led devices 214 that emit different colors of light. In such an exemplary red-green-blue (RGB) sub-pixel arrangement, each pixel includes three sub-pixels that emit red, green, and blue light. The RGB arrangement is exemplary and embodiments are not so limited. For example, alternative sub-pixel arrangements include red-green-blue-yellow (RGBY), red-green-blue-yellow-cyan (RBGYC), red-green-blue-white (RGBW), or other sub-pixel matrix schemes where the pixels have a different number of sub-pixels, such as displays manufactured under the trademark name PenTile®. In the exemplary embodiments illustrated in the following description, a single micro chip 216 is illustrated as controlling two pixels. It is to be appreciated that this configuration is likewise exemplary and embodiments are not so limited. For example, each micro chip 216 can switch and drive one or more LED devices 214 arranged in series, in parallel, or a combination of the two, such that multiple LED devices are driven from the same control signal. A variety of alternative configurations are contemplated in accordance with embodiments of the invention. In other embodiments, sensors such as touch sensors or light sensors can also be located on the front surface of the display substrate within the display area similarly as the micro chips.

In one aspect, embodiments of the invention describe display panels and display module packaging configurations in which micro LED devices and/or micro chips are transferred and bonded to a wiring 212 using an electrostatic transfer head assembly. In accordance with embodiments of the present invention, a pull-in voltage is applied to an electrostatic transfer head in order to generate a grip pressure on a micro LED device or micro chip. It has been observed that it can be difficult to impossible to generate sufficient grip pressure to pick up micro devices with vacuum chucking equipment when micro device sizes are reduced below a specific critical dimension of the vacuum chucking equipment, such as approximately 300 μm or less, or more specifically approximately 100 μm or less. Furthermore, electrostatic transfer heads in accordance with embodiments of the invention can be used to create grip pressures much larger than the 1 atm of pressure associated with vacuum chucking equipment. For example, grip pressures of 2 atm or greater, or even 20 atm or greater may be used in accordance with embodiments of the invention. Accordingly, in one aspect, embodiments of the invention provide the ability to transfer and integrate micro LED devices and micro chips into applications in which integration is not possible with current vacuum chucking equipment. In some embodiments, the term "micro" chip, "micro" LED device, or other "micro" structure may refer to the descriptive size, e.g. length or width, of certain devices or structures. In some embodiments, "micro" chips or "micro" LED devices may be on the scale of 1 μm to approximately 300 μm or less, or 100 μm or less in many applications. However, embodiments of the present invention are not necessarily so limited, and certain aspects of the embodiments may be applicable to larger micro devices or structures, and possibly smaller size scales.

Figure 4:
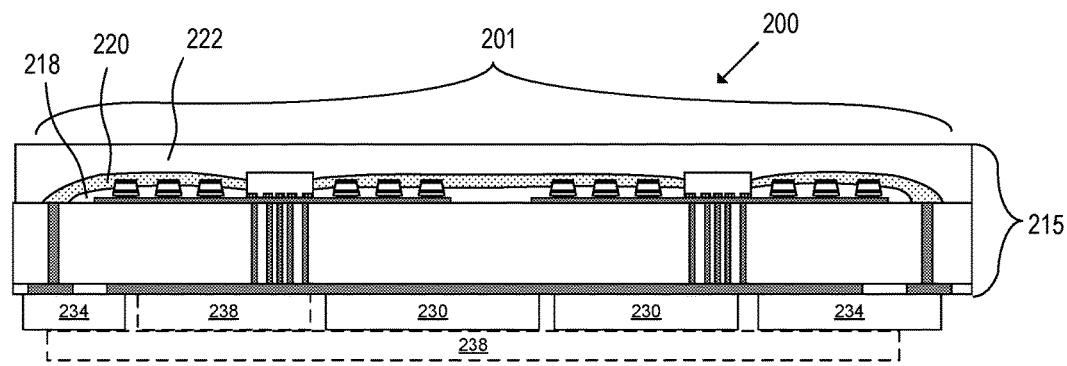
FIG. 4 is a schematic cross-sectional side view illustration of a display module including one or more driver circuits on the back surface of the display substrate directly behind the display area in accordance with an embodiment of the invention.

Referring now to FIG. 4, following the transfer and bonding of the arrays of LEDs 216 and micro chips 216 a passivation layer 218 may be provided between the LEDs 216 and covering the wiring layer 212 followed by the deposition of a top contact layer 220. In an embodiment, top contact layer 220 may be in electrical contact with a Vss line or Vss plane, for example that may be in electrical connection with the one or more through vias 206. Alternatively the Vss line or Vss plane may be located on the top surface 203 of the display substrate 202. Following the formation of top contact layer 220, an encapsulation layer 222 may be formed over the display substrate. In some embodiments the encapsulation layer 222 may be a flexible encapsulation layer.

In accordance with embodiments of the invention, passivation layer 218 may be transparent or semi-transparent to the visible wavelength so as to not significantly degrade light extraction efficiency of the completed system. Passivation layer 218 may be formed of a variety of materials such as, but not limited to epoxy, poly(methyl methacrylate) (PMMA), benzocyclobutene (BCB), polyimide, and polyester. In an embodiment, passivation layer 218 is formed by ink jetting around the LEDs 214.

Depending upon the particular application, top contact layer 220 may be opaque, reflective, transparent, or semi-transparent to the visible wavelength. For example, in top emission systems the top contact layer 220 may be transparent, and for bottom emission systems the top conductive contact may be reflective. Exemplary transparent conductive materials include amorphous silicon, transparent conductive oxides (TCO) such as indium-tin-oxide (ITO) and indium-zinc-oxide (IZO), carbon nanotube film, or a transparent conductive polymer such as poly(3,4-ethylenedioxythiophene) (PEDOT), polyaniline, polyacetylene, polypyrrole, and polythiophene. In an embodiment top conductive contact layer 220 is approximately 50 nm-1 μm thick ITO-silver-ITO stack. In an embodiment, the top conductive contact layer 220 includes nanoparticles such as silver, gold, aluminum, molybdenum, titanium, tungsten, ITO, and IZO. In a particular embodiment, the top conductive contact 220 is formed by ink jetting. Other methods of formation may include chemical vapor deposition (CVD), physical vapor deposition (PVD), spin coating.

In embodiments where top conductive layer 220 is transparent, the top encapsulation layer 222 may also be transparent or semi-transparent so as to not degrade light extraction efficiency of the system. Top encapsulation layer 222 may be formed of a variety of materials such as, but not limited to, silicon oxide ($SiO_2$), silicon nitride ($SiN_x$), poly (methyl methacrylate) (PMMA), benzocyclobutene (BCB), polyimide, and polyester, and may be formed by a variety of methods including chemical vapor deposition (CVD), physical vapor deposition (PVD), spin coating.

Still referring to FIG. 4, in accordance with embodiments of the invention, driver ICs 230 and additional devices and IC chips 234 for operating the display module 200 are located on the back surface 205 of the display substrate 102 of the display panel 215. For example, IC chips 234 can include a power management IC, processor, memory, timing controller, touch sense IC, wireless controller, communications IC, etc. As illustrated, the driver ICs 230 and additional IC chips 234 may be located on the back surface of the display substrate directly behind the display area 201. In one embodiment, a battery 238 may also be formed on RDL 208 on the back surface 205, or alternatively a thin film battery 238 can be formed on the array of IC chips 230, 234.

In an embodiment, the driver ICs 230 are in electrical connection with wiring 210A in RDL 208, which are in electrical connection with interconnects illustrated as through vias 204 extending between the front surface and back surface of the display substrate 202, which are in electrical connection with wiring layer 212 on the top surface of display substrate 202, which is in electrical connection with the LEDs 214 and optional micro chips 216. In an embodiment wiring layer 212 includes scan lines, which are coupled to one or more scan driver ICs 230, and data lines which are coupled to one or more data driver ICs 230 located on the back surface 204 of the display substrate 202 through vias 204. The LEDs 214 may each be coupled to a common Vss through a through via 206, or a plurality of through vias 216.

Figure 5A:
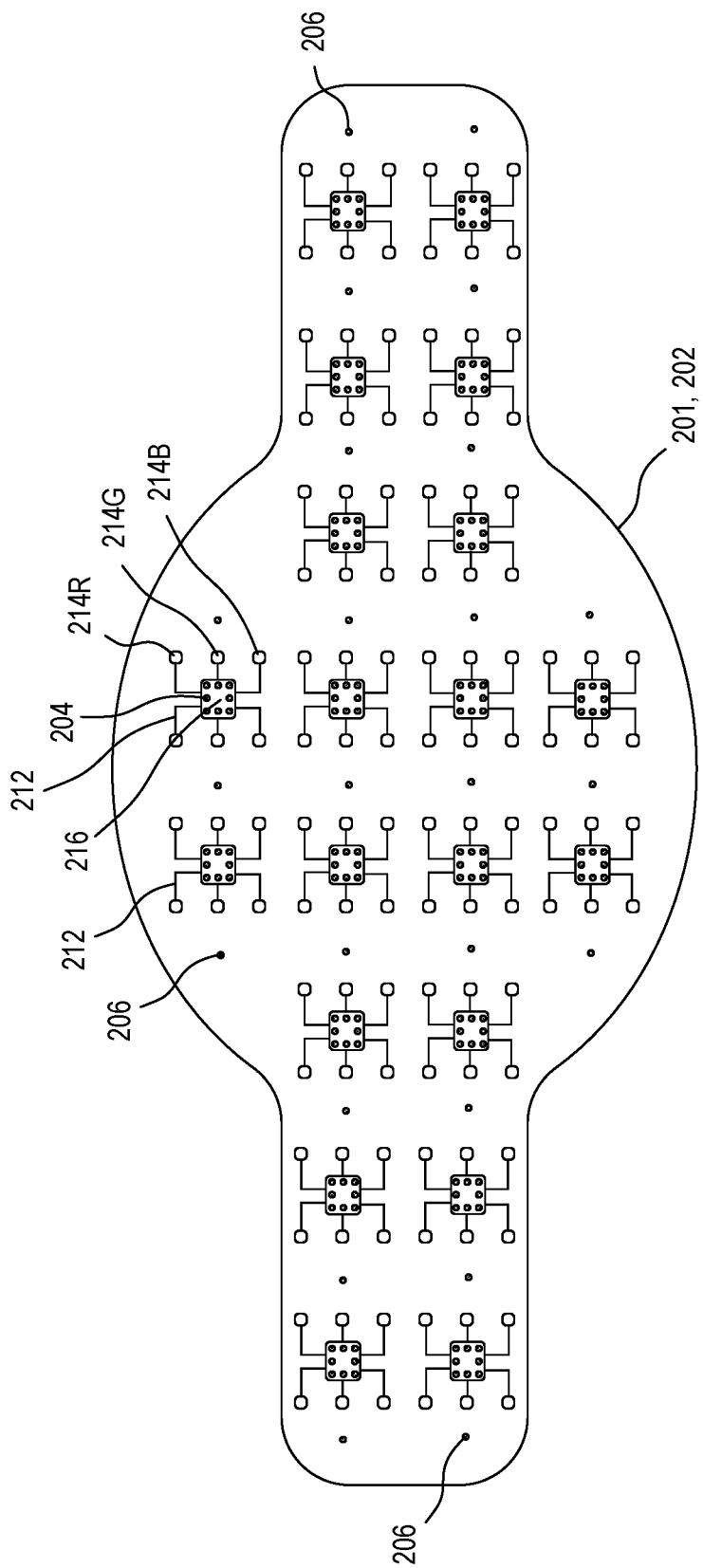
FIG. 5A is a schematic front view illustration of a display substrate including an array of LEDs and micro chips in a display area and a plurality of through vias directly beneath the display area, where the array of micro chips overlap the plurality of through vias in accordance with an embodiment of the invention.
Figure 5B:
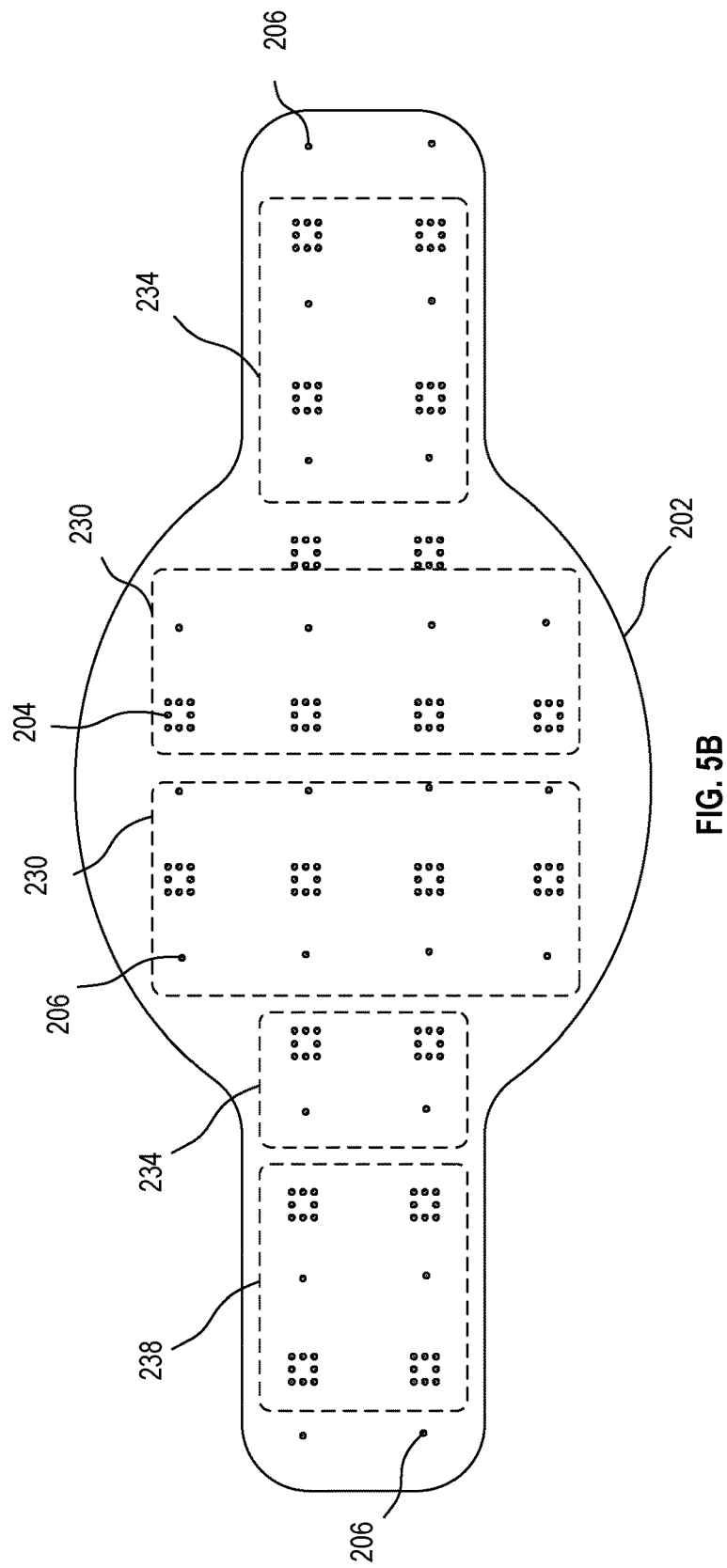
FIG. 5B is a schematic back view illustration of a display substrate including one or more driver circuits on the back surface of the display substrate and a plurality of through vias directly behind the display area in accordance with an embodiment of the invention.

FIG. 5A is a schematic front view illustration of a display substrate 202 including an array of LEDs 214 and micro chips 216 in a display area and a plurality of through vias 204, 206 directly beneath the display area, where the array of micro chips overlap the plurality of through vias in accordance with an embodiment of the invention. As shown in FIG. 5A, the display area 201 may include the entire surface of display substrate 202, or at least the maximum amount of surface possible for placing the LEDs and micro chips. Through vias 204 may be connected to any of the chips 230, 234 on the back surface of the display substrate 202. For example, through vias 204 may connect a micro chip 216 to a data line, scan line, Vdd, clock, etc. In the particular embodiment illustrated through vias 204 are directly beneath the array of micro chips 216, and Vss through vias 206 are interspersed through the display area between the micro chips 216. FIG. 5B is a schematic back view illustration of a display substrate 202 including one or more driver circuits 230 on the back surface of the display substrate and a plurality of through vias 204, 206 directly behind the display area in accordance with an embodiment of the invention. As shown a number of additional IC chips 234 and battery 238 may also be located directly behind the display area.

Figure 5C:
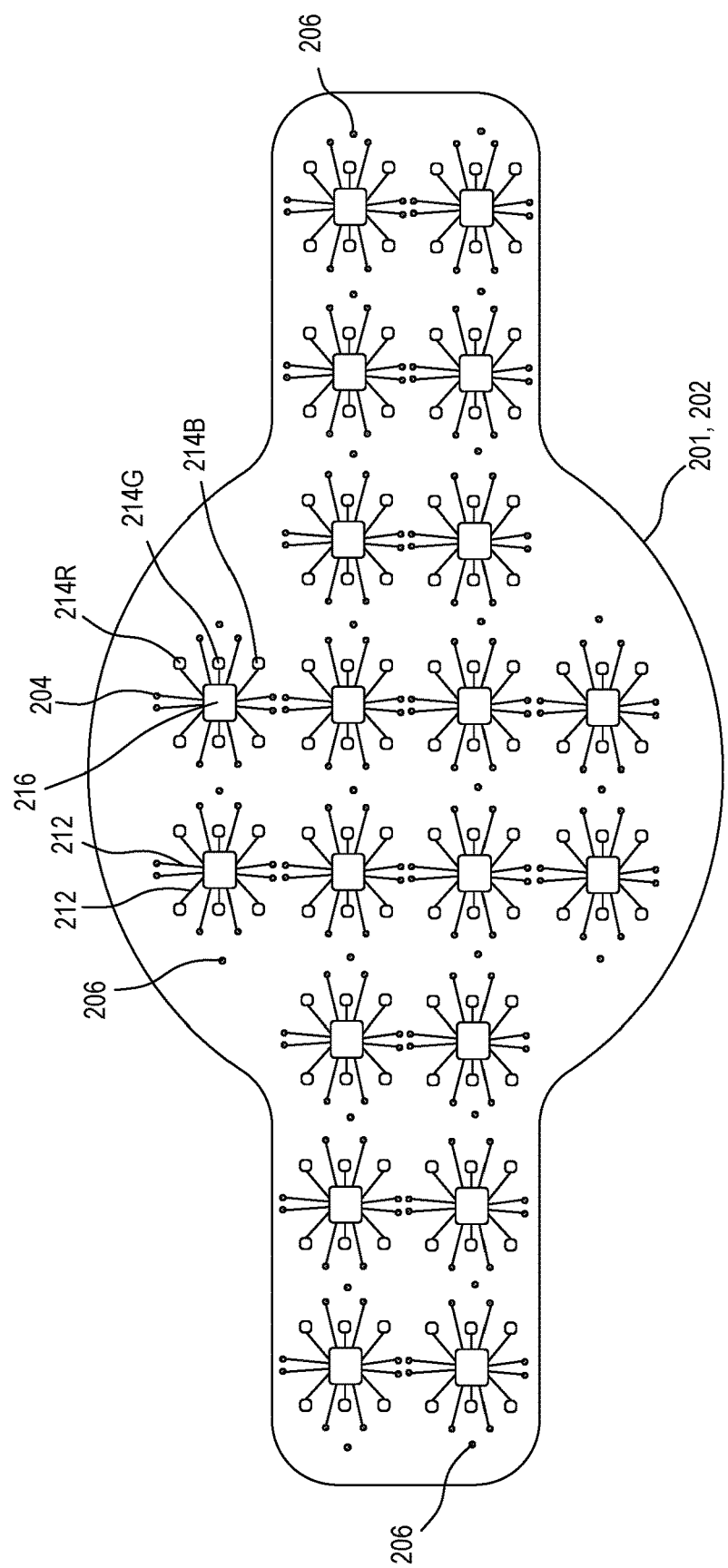
FIG. 5C is a schematic front view illustration of a display substrate including an array of LEDs and micro chips in a display area and a plurality of through vias directly beneath the display area, where the array of micro chips do not overlap the plurality of through vias in accordance with an embodiment of the invention.

FIG. 5C is schematic front view illustration of a display substrate including an alternative arrangement of an array of LEDs and micro chips in a display area 201 and a plurality of through vias directly beneath the display area 201, where the array of micro chips 216 do not overlap the plurality of through vias 204, 206 in accordance with an embodiment of the invention. For example, the plurality of through vias 204, 206 can be interspersed between the micro chips 216 as illustrated in FIG. 5C. In the exemplary embodiment illustrated in FIG. 5C, wiring 212 is illustrated connecting the plurality of through vias 204 and LEDs 214 to the array of micro chips 216.

Figure 5D:
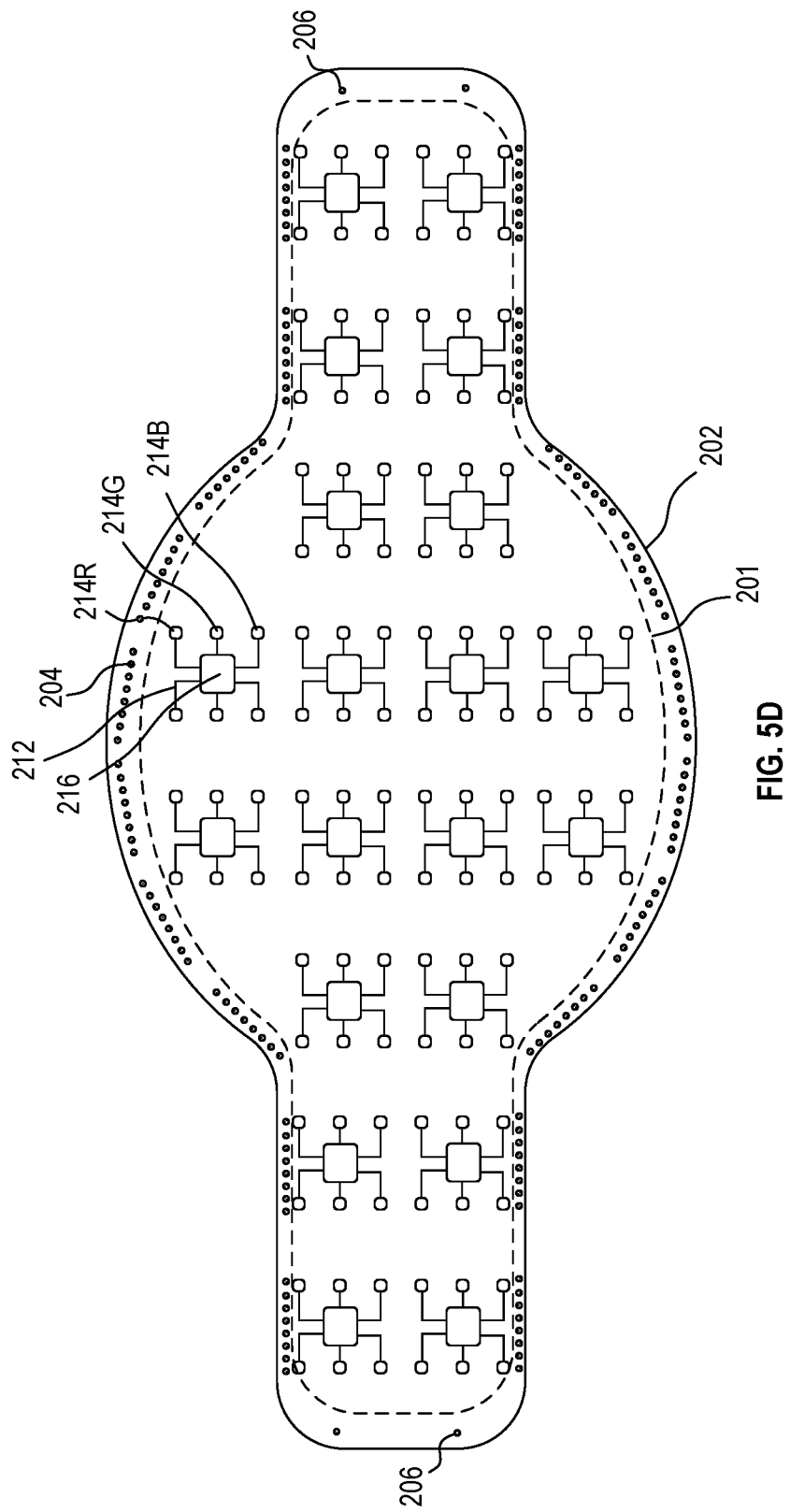
FIG. 5D is a schematic front view illustration of a display substrate including an array of LEDs and micro chips in a display area and a plurality of through vias outside of the display area in accordance with an embodiment of the invention.
Figure 6A:
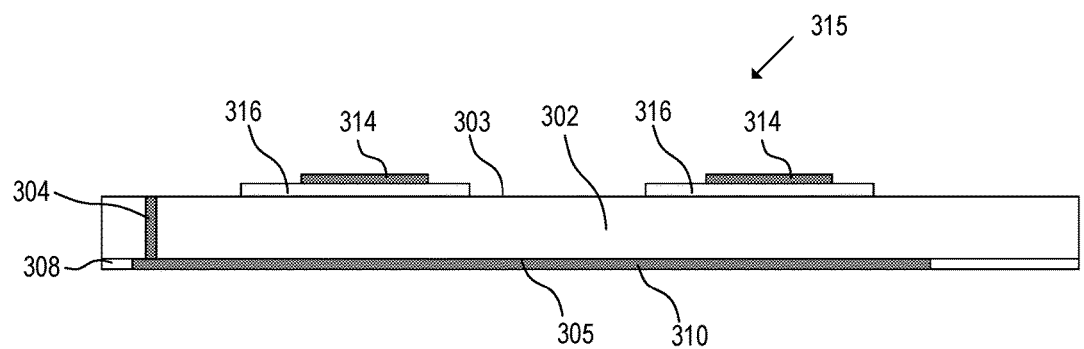
FIG. 6A is a schematic cross-sectional side view illustration of TFT display substrate including one or more through vias in accordance with an embodiment of the invention.
Figure 6B:
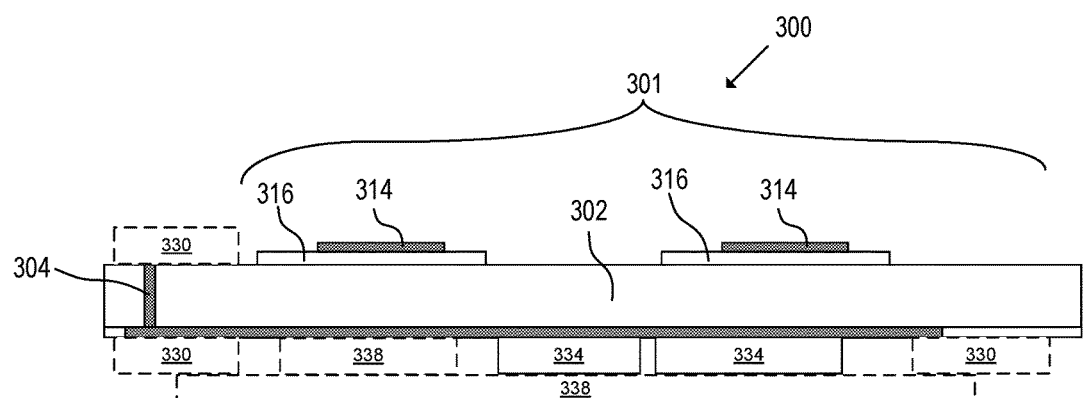
FIG. 6B is a schematic cross-sectional side view illustration of a TFT display substrate and display module including an array of LEDs in a display area and one or more through vias outside of the display area in accordance with an embodiment of the invention.
Figure 7A:
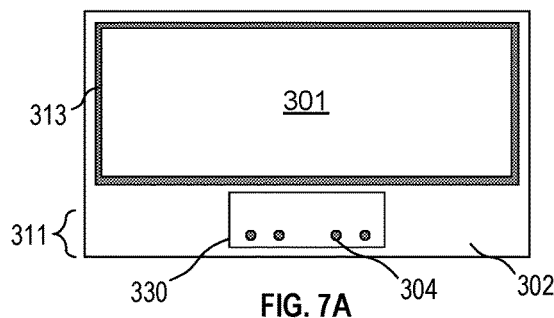
FIGS. 7A-7B are schematic front view illustration of a TFT substrate and display module including one or more driver circuits in contact with one or more through vias outside of the display area in accordance with embodiments of the invention.
Figure 7B:
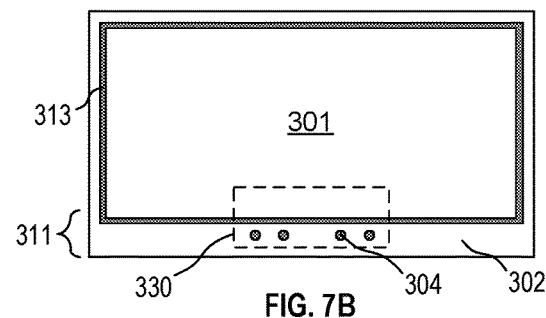

FIG. 5D is a schematic front view illustration of a display substrate including an array of LEDs and micro chips in a display area 201 and a plurality of through vias outside of the display area 201 in accordance with an embodiment of the invention. As shown in FIG. 5D, the display area 201 may be smaller than the front surface of display substrate 202, and the plurality of through vias 204, 106 are located along a periphery of the display substrate 202 outside of the display area 201. In the exemplary embodiment illustrated in FIG. 5D, wiring 212 has not been illustrated for connecting the plurality of through vias 204 to the micro chips 216 in order to not obscure the illustration.

Referring now to FIGS. 6A-8, the packaging configurations in accordance with embodiments of the invention are applied to an existing OLED display panel 315 to form a display module 300. In the embodiment illustrated in FIG. 6A, a display substrate 302 is a TFT backplane including working circuitry 316 and organic LEDs 314. Exemplary TFT working circuitries 316 may include amorphous-silicon based, poly-silicon based, and indium-gallium-zinc-oxide based technologies. In an embodiment, through vias 304 can be formed through the display substrate in the contact ledge area 311 that is conventionally reserved for driver ICs and a FPC. Referring now to FIG. 6B, similar to the previous embodiments described and illustrated, additional devices and IC chips 334 for operating the display module 300 are located on the back surface 305 of the display substrate 302. For example, IC chips 334 can include a power management IC, processor, memory, timing controller, touch sense IC, wireless controller, communications IC, etc. As illustrated, the additional IC chips 334 may be located on the back surface of the display substrate directly behind the display area 301. In the embodiment illustrated in FIG. 7A, a driver IC 330 is located on the front surface 303 of the display substrate 302. The driver IC 330 may be in electrical connection with the through vias 304 which in turn are in electrical communication with the wiring 310 in RDL 308 on the back surface 305 of the display substrate 302. In the embodiment illustrated in FIG. 7B, a driver IC 330 is located on the back surface 305 of the display substrate 302, and in electrical communication with the through vias 304. In the embodiment illustrated in FIG. 7A, the driver ICs 330 are formed on the top surface of the display substrate 302 reserved for the contact ledge 311. In the embodiment illustrated in FIG. 7B, the drive IC 330 is at least partially located directly behind the display area 301. In either configuration, the driver IC 330 communicates with the working circuitry 316 similarly as with a conventional OLED display.

Figure 8:
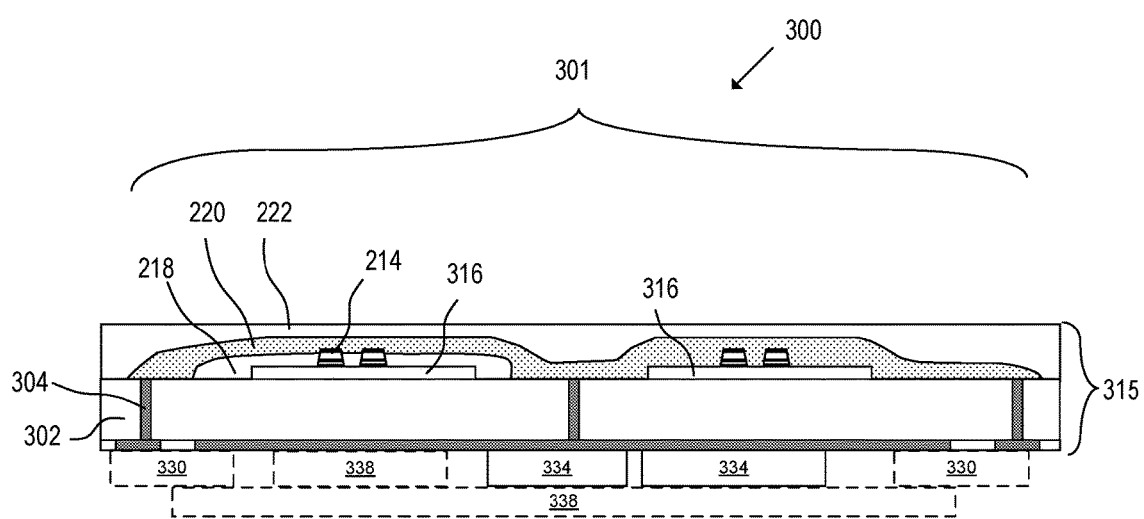
FIG. 8 is a schematic front view illustration of a TFT display substrate and display module including an array of LEDs and a plurality of through vias in accordance with an embodiment of the invention.

FIG. 8 is a schematic front view illustration of a TFT display substrate and display module including an array of LEDs and a plurality of through vias in accordance with an embodiment of the invention. The particular embodiment illustrated in FIG. 8 is similar to that previously illustrated in FIG. 4, with a TFT display substrate including working circuitry 316 replacing micro chips 216. In an embodiment, through vias 304 can be formed through the display substrate directly behind the display area 301.

Figure 9:
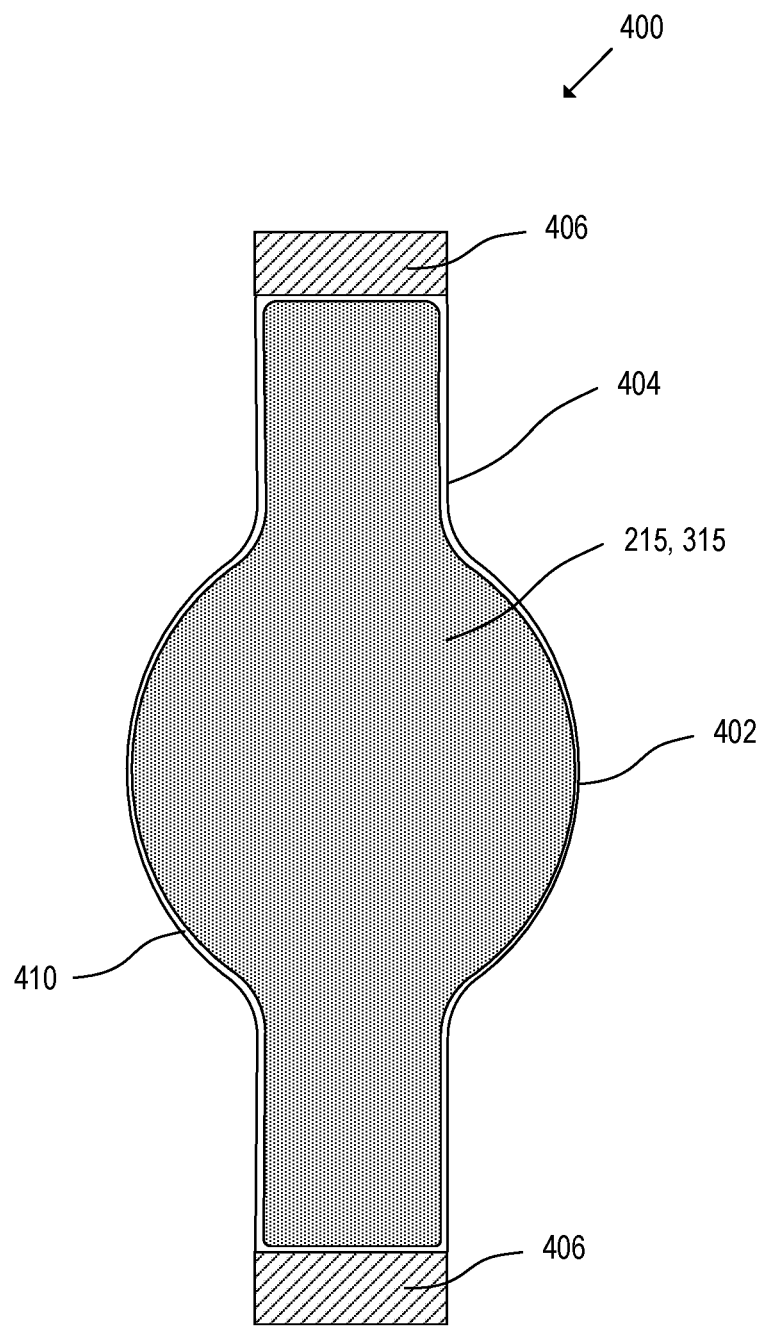
FIG. 9 is a schematic front view illustration of a wearable electronic device including a display panel in accordance with an embodiment of the invention.

FIG. 9 is a schematic front view illustration of a wearable electronic device including a display panel in accordance with an embodiment of the invention. The wearable electronic device 400 may be any of a number of wearable accessory products that include a display panel 215, 315, and in particular a flexible display panel 215, 315. The flexible display panel 215, 315 may be formed in any of the display modules described above. In an embodiment, the flexible display panel 215, 315 does not include a contact ledge 111, which may allow for increased allocation space to the display area 201.

In one embodiment, the wearable electronic device is a smartwatch including a watch face 402, band 404, and clasp 406. A flexible display panel 215, 315 may be integrated into the smartwatch so that it spans both the watch face and band. In this manner, the flexible display panel 215, 315 can be adjusted to the contour of a user's arm. In accordance with embodiments of the invention, a bezel 410 width surrounding the display panel 215, 315 can be minimized, for example below 4-5 mm or even less than 1 mm, less than 0.5 mm, or eliminated. Thus, the bezel 210 design of the smartwatch can be designed for aesthetic concerns rather than as a requirement for allocating space for a contact ledge.

Figure 10:
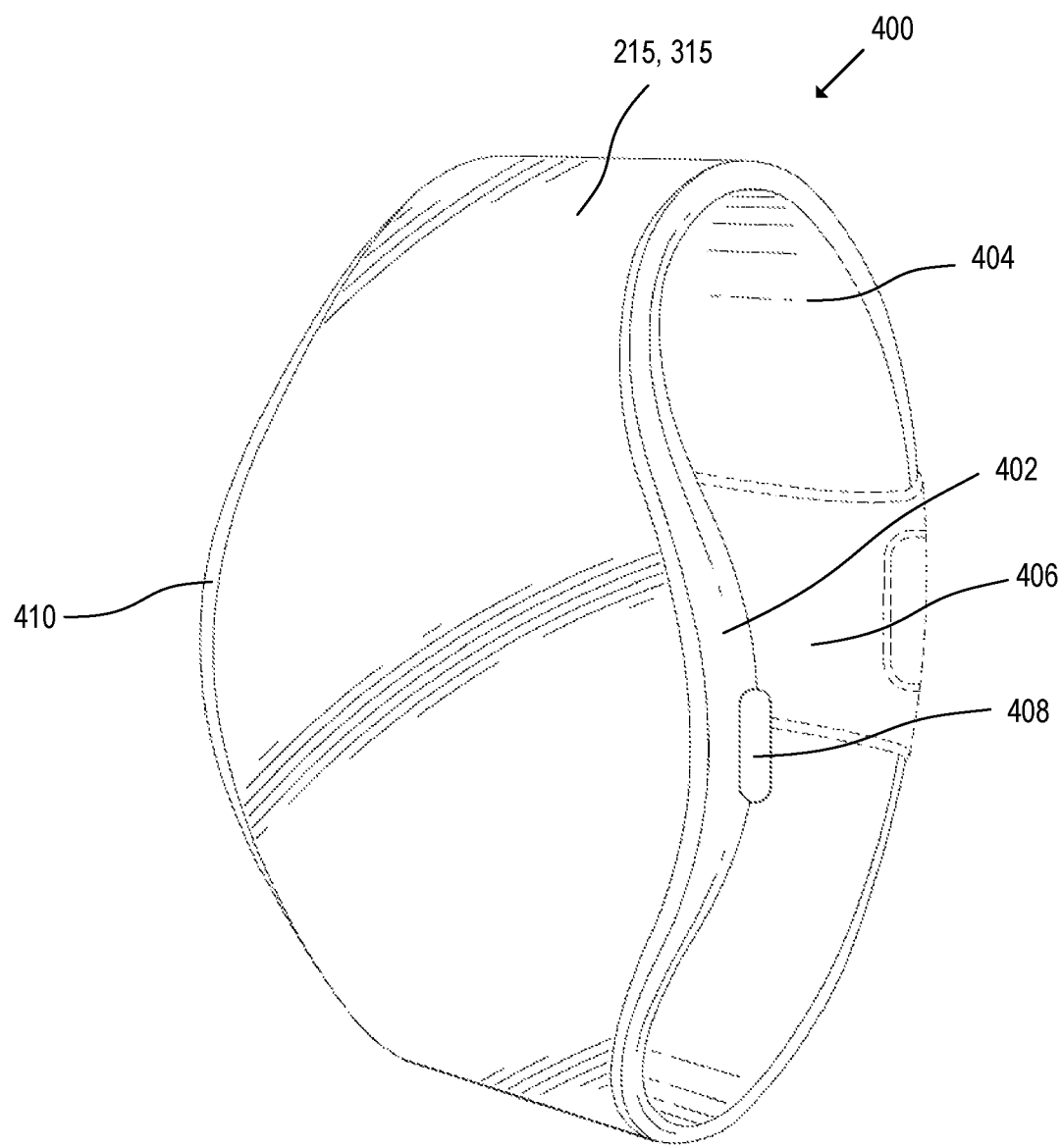
FIGS. 10-12 are perspective view illustrations of a wearable electronic device displaying various display images in accordance with embodiments of the invention.
Figure 11:
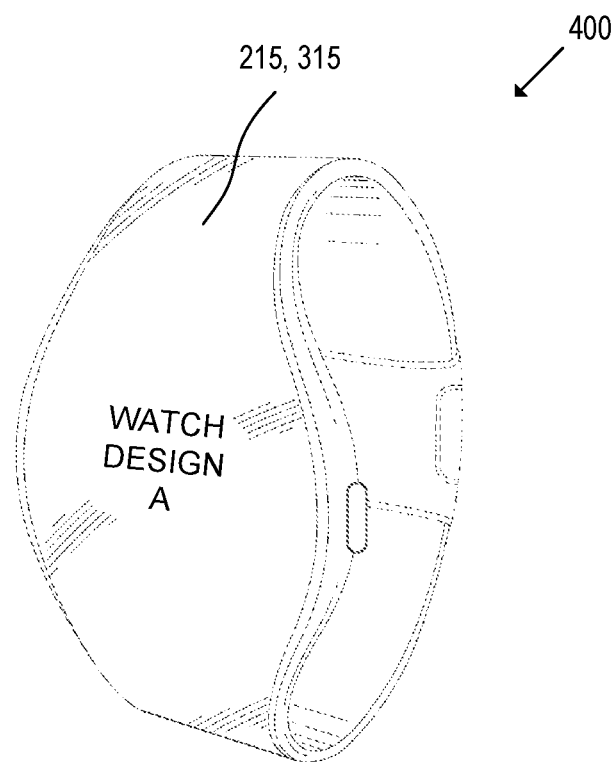
Figure 12:
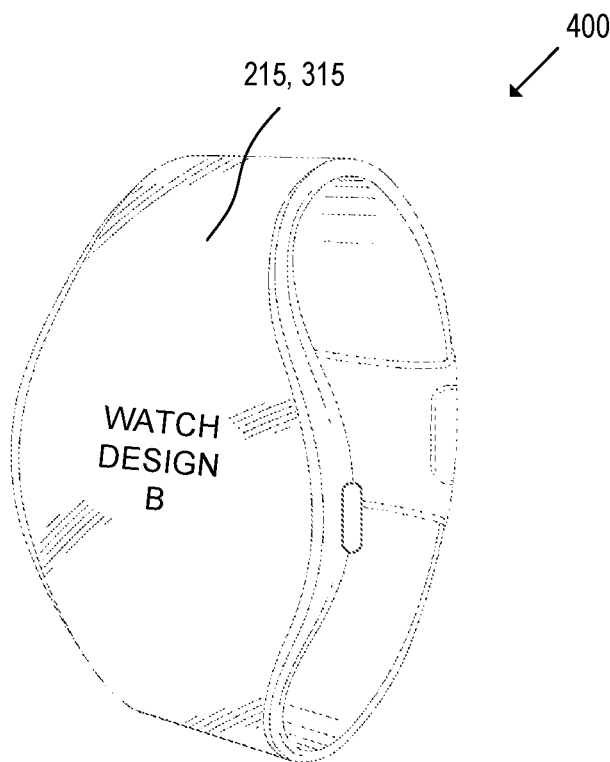

FIGS. 10-12 are perspective view illustrations of a wearable electronic device displaying various display images in accordance with embodiments of the invention. In the embodiment, illustrated in FIG. 10, the wearable electronic device 400 is illustrated with a blacked out display area of the display panel 215, 315. For example, this may indicate a state in which the display panel is turned off. FIGS. 11-12 illustrate states of where the display panel is displaying different images. For example, FIG. 11 may display a watch design A, including watch face and band and FIG. 12 may display a watch design B, including a watch face and band. Any number of displayed images are possible.

Figure 13:
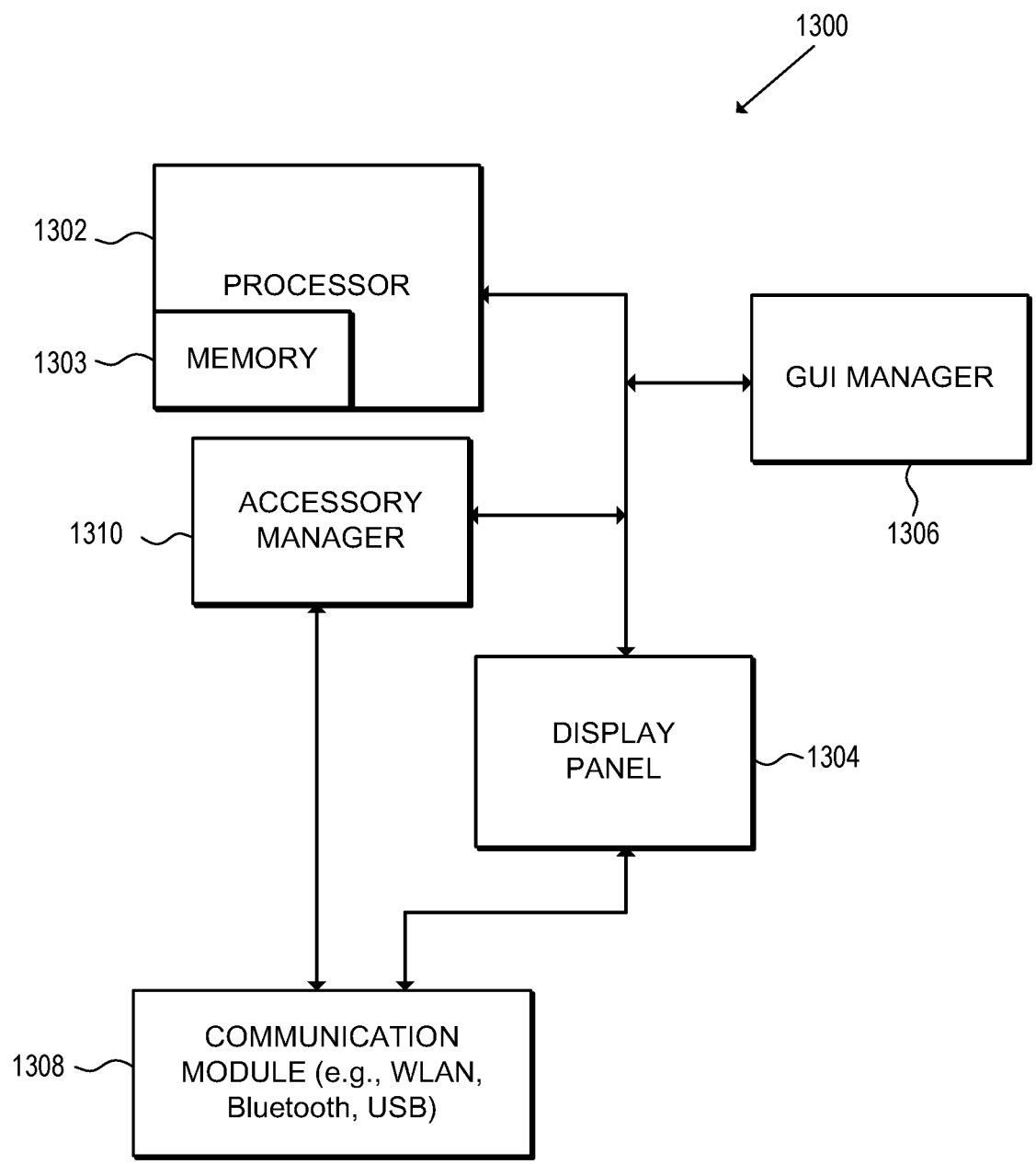
FIG. 13 is a system diagram of a wearable electronic device having a display panel in accordance with an embodiment of the invention.

FIG. 13 illustrates a system diagram of an embodiment of wearable display module 1300. For example, the wearable display module 1300 may be incorporated into the wearable electronic devices of FIGS. 10-12, and include any of the flexible display panels described herein. The module 1300 includes a processor 1302 and memory 1303 for managing the wearable electronic devices and executing or interpreting instructions and commands for the wearable electronic devices. The processor 1302 can be a general-purpose processor or a microcontroller for controlling the wearable electronic devices. The memory 1303 can be integrated within the processor 1302, or coupled to the processor 1302 via a memory bus. The memory 1303 includes nonvolatile storage, such as flash memory, and can additionally include read only memory (ROM), and a form of volatile random access memory (RAM). In one embodiment, the processor 1302 includes media decode capability, to display encoded content via a flexible display panel 1304. In one embodiment, the module 1300 includes a graphical user interface (GUI) manager 1306, to control information that is provided to and displayed on the flexible display panel 1304.

The module 1300 also includes a communication module 1308 that facilitates communication between the module 1300 and other electronics. In one embodiment, the communication module 1308 includes a module to provide connectivity via universal serial bus (USB). The communication module 1308 can further include wireless transceivers for Bluetooth, or WLAN connectivity, and can additionally include one or more WWAN transceivers to communicate with a wide area network including a cellular data network.

In one embodiment, the module 1300 includes an accessory manager 1310 that operates to authenticate and acquire data from an additional electronic device that can be coupled to the module 1300. In one embodiment, the module 1300 is an accessory to a primary display device, and the accessory manager 1310 facilitates the connection of the additional electronic device to the module 1300. In one embodiment, the module 1300 may have accessory devices that are managed by the accessory manager 1310, which facilitates the transfer of data to and from accessory devices.

In an embodiment, memory 1303 includes non-transitory computer-readable medium stores instructions which, when executed by processor 1302, cause the processor to perform operations to adjust display data for a flexible display panel 1304 of the module 1300. In an embodiment, the operations including receiving input from a control device, the input including data for the flexible display panel, parsing the input to derive the data for display, and displaying the derived data on the flexible display panel. In an embodiment, the operations further include receiving a configuration of the flexible display panel of the watch face and band, receiving a design from the derived data, (e.g. type of watch design including a watch face and watch band), and updating the flexible display panel spanning the watch face and watch band of the smartwatch with the received design.

In an embodiment, an accessory manager is coupled to the flexible display substrate 1304 to receive input from a control device communicatively coupled to the module 1300. A graphical user interface (GUI) manager is coupled to the display substrate, to control information displayed on the display substrate, where the display substrate includes a first display area associated with a face of the wearable electronic device and a second display area associated with a band of the wearable electronic device. In an embodiment, the GUI manager provides a watch face design to the first display area and a watch band design to the second display area. In an embodiment, the accessory manager receives input data from a control device via a communication module, the input data including configuration data for the GUI manager.

Figure 14:
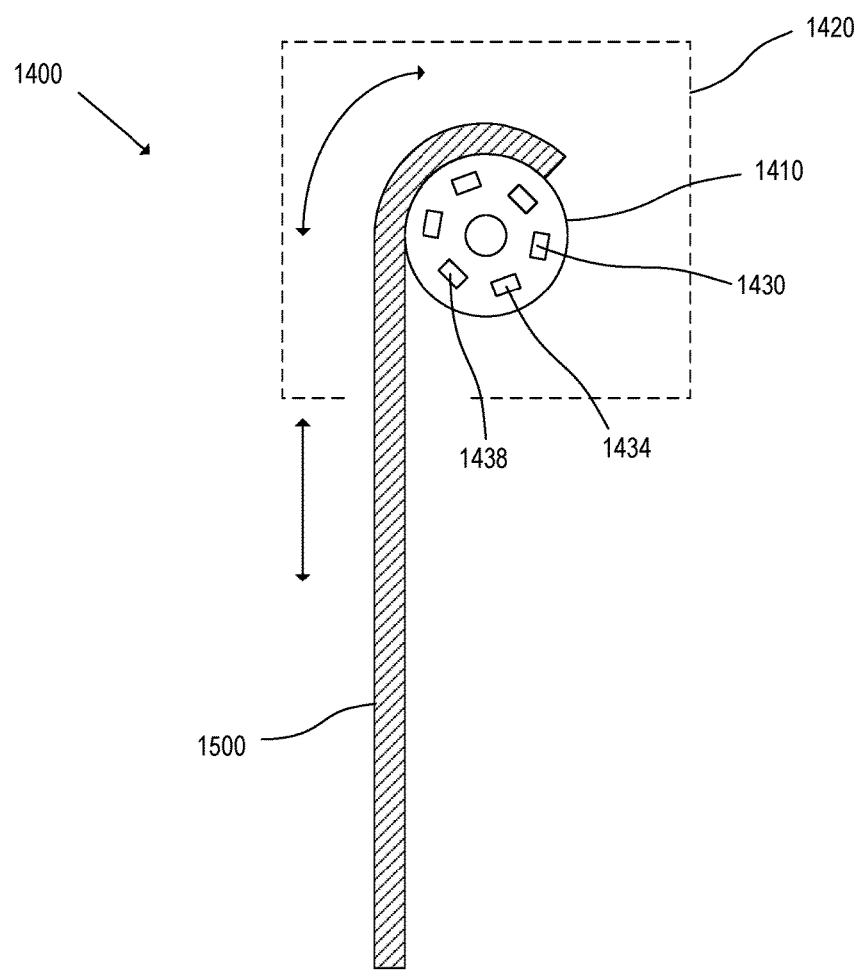
FIG. 14 is schematic cross-sectional side view illustration of a system including a flexible display panel secured to a spool in accordance with an embodiment of the invention.
Figure 15:
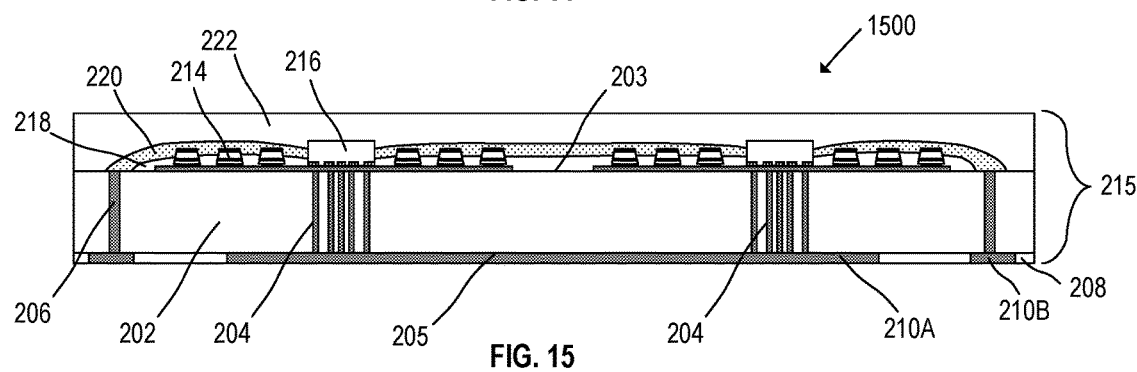
FIG. 15 is a schematic cross-sectional side view illustration of a flexible display panel including an array of LEDs and micro chips in a display area on a front surface of the display substrate in accordance with an embodiment of the invention.

FIG. 14 is schematic cross-sectional side view illustration of a system 1400 including a flexible display panel 1500 secured to a spool 1410 in accordance with an embodiment of the invention. FIG. 15 is a schematic cross-sectional side view illustration of a flexible display panel 1500 including an array of LEDs 214 and micro chips 216 in a display area on a front surface 203 of the display substrate 202 in accordance with an embodiment of the invention. The display panel 1500 illustrated in FIGS. 14-15 may be similar to any of the display panels previously described above. In the embodiment illustrated in FIGS. 14-15, the flexible display panel 1500 is rollable into and out of a housing 1420. In such an embodiment, rather than locating the driver ICs 1430 additional IC chips 1434 and battery 1438 on the back surface 205 of the display substrate 202, any combination of these components can be located within the housing 1420, such as on the spool 1410. In other embodiments, any of these components may also be located on the back surface 205 of the display substrate. For example, a thin film battery 1438 can be located on the back surface, or a plurality of batteries 1438 can be located on the back surface. Likewise one or more driver ICs 1430 may be located on the back surface to reduce transmission line distance to the micro chips 216.

Figure 16:
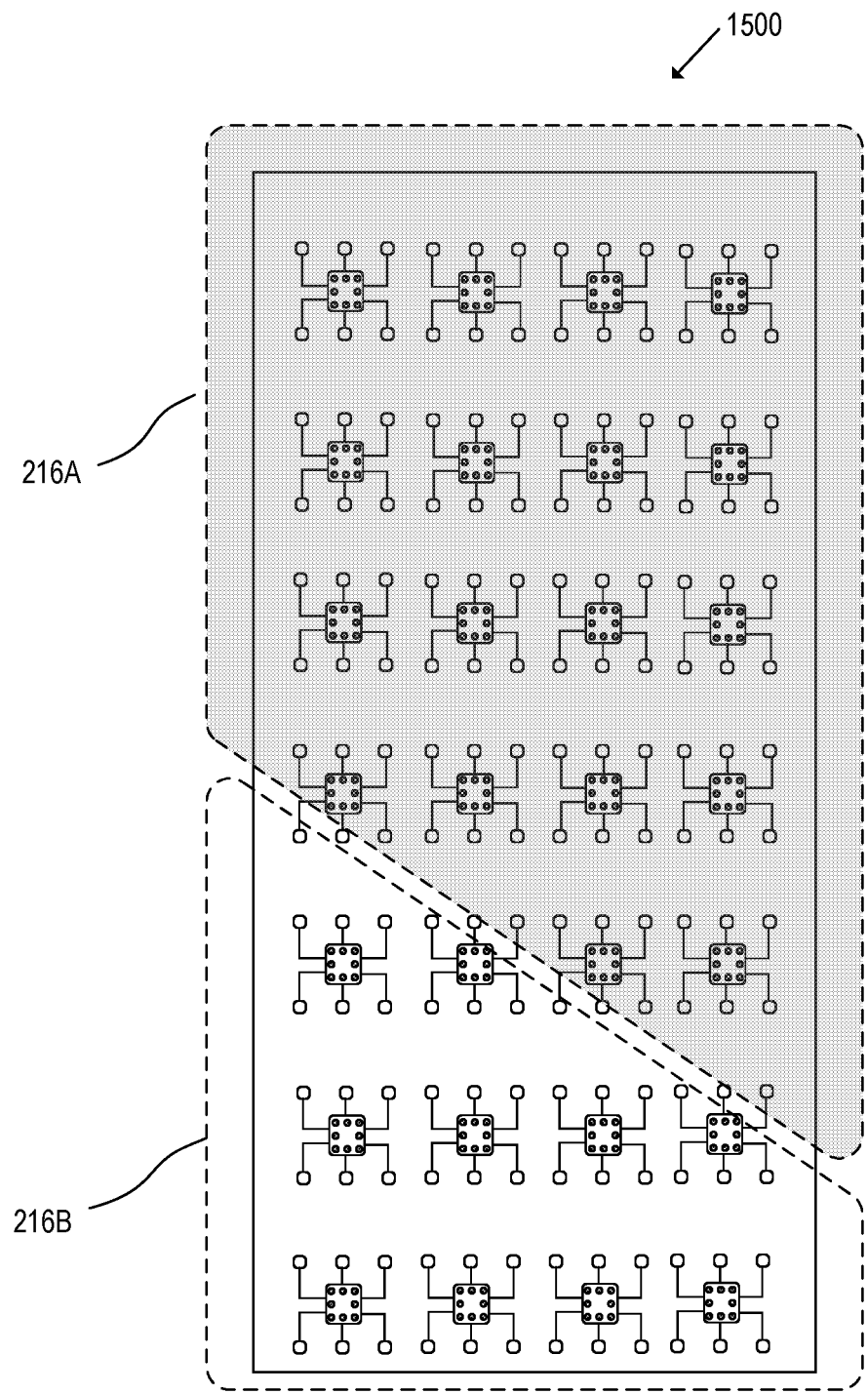
FIG. 16 is a schematic front view illustration of a flexible display panel including two areas of micro chips exposed to different levels of ambient light in accordance with an embodiment of the invention.

In an embodiment, the micro chips 216 may include ambient light sensors to measure the ambient light striking the display area of the flexible display panel 1500. Referring to FIG. 16, a schematic front view illustration is provided of a flexible display panel 1500 including two areas of micro chips 216A, 216B exposed to different levels of ambient light in accordance with an embodiment of the invention. In an embodiment, area 216B of micro chips 216 is exposed to a greater amount of light than area 216A, for example, glare from a window within a display room. In such an embodiment, a processor or ambient light controller in the system 1400 may increase the amount of light being emitted from the LEDs 214 operated by the micro chips 216 in area 216B in order to compensate for the ambient light.

Figure 17:
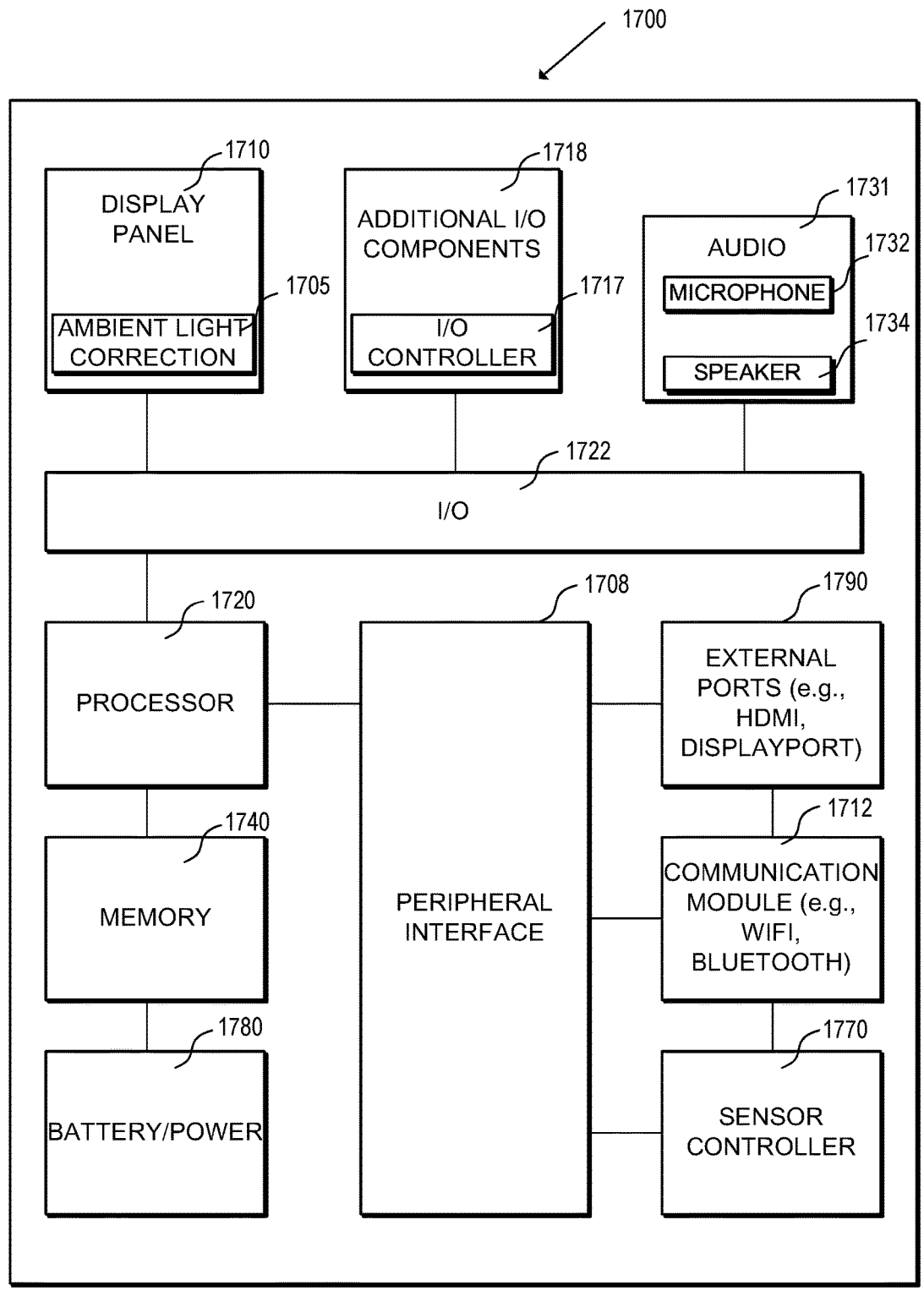
FIG. 17 is a system diagram of a display system including the flexible display panel in accordance with an embodiment of the invention.

FIG. 17 illustrates a system diagram 1700 for an embodiment of a display system (e.g. a television) including a flexible display panel 1710 described herein, including the system and display panels described with regard to FIGS. 14-16. The display system 1700 includes a processor 1720 and memory 1704 for managing the system and executing instructions. The memory includes non-volatile memory, such as flash memory, and can additionally include volatile memory, such as static or dynamic random access memory (RAM). The memory 1704 can additionally include a portion dedicated to read only memory (ROM) to store firmware and configuration utilities. In an embodiment, the processor 1720 manages ambient light correction of the flexible display panel 1710 by controlling each micro chip 216 output to LED devices 214 where light output is adjusted based on light sensor data from a sensor controller 1770. Alternatively, such an ambient light correction module 1705 can be located on each of the micro chips 214 within the display panel 1710.

The system also includes a power module 1780 (e.g., flexible batteries, wired or wireless charging circuits, etc.), a peripheral interface 1708, and one or more external ports 1790 (e.g., Universal Serial Bus (USB), HDMI, Display Port, and/or others). In one embodiment, the display system 1700 includes a communication module 1712 configured to interface with the one or more external ports 1790. For example, the communication module 1712 can include one or more transceivers functioning in accordance with IEEE standards, 3GPP standards, or other communication standards, and configured to receive and transmit data via the one or more external ports 1790. The communication module 1712 can additionally include one or more WWAN transceivers configured to communicate with a wide area network including one or more cellular towers, or base stations to communicatively connect the display system 1700 to additional devices or components. Further, the communication module 1712 can include one or more WLAN and/or WPAN transceivers configured to connect the electronic device 1700 to local area networks and/or personal area networks, such as a Bluetooth network.

The display system 1700 can further include a sensor controller 1770 to manage input from one or more sensors such as, for example, proximity sensors, ambient light sensors, or infrared transceivers. In an embodiment, the array of micro chips 216 on the display panel includes an array of light sensors in communication with the sensor controller. Each micro chip 216 may include a light sensor, or only portion of the array of micro chips includes light sensors. For example, the array of light sensors can be uniformly distributed in the array of micro chips. In one embodiment the system includes an audio module 1731 including one or more speakers 1734 for audio output and one or more microphones 1732 for receiving audio. In embodiments, the speaker 1734 and the microphone 1732 can be piezoelectric components. The electronic device 1700 further includes an input/output (I/O) controller 1722, a display screen 1710, and additional I/O components 1718 (e.g., keys, buttons, lights, LEDs, cursor control devices, haptic devices, and others). The display device/screen 1710 and the additional I/O components 1718 may be considered to form portions of a user interface (e.g., portions of the display system 1700 associated with presenting information to the user and/or receiving inputs from the user).

In utilizing the various aspects of this invention, it would become apparent to one skilled in the art that combinations or variations of the above embodiments are possible for forming flexible display panels and system applications including the flexible display panels. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. An electronic device comprising:
   a substrate including a first side and a second side;
   a first wiring layer on the first side;
   an array of LEDs on and in electrical contact with the first wiring layer on the first side of the substrate;
   a plurality of interconnects extending through the substrate from the first side to the second side; and
   a second wiring layer on the second side of the substrate.

2. The electronic device of claim 1, further comprising an array of micro chips connected with the first wiring layer to drive the array of LEDs.

3. The electronic device of claim 2, wherein each micro chip is connected with a corresponding plurality of LEDs.

4. The electronic device of claim 3, wherein the array of LEDs is located in a display area of the display substrate.

5. The electronic device of claim 4, further comprising a timing controller chip electrically connected with the second wiring layer.

6. The electronic device of claim 5, wherein the array of micro chips is interspersed among the array of LEDs.

7. The electronic device of claim 4, further comprising a plurality of integrated circuit (IC) chips in electrical connection with the second wiring layer.

8. The electronic device of claim 7, wherein the plurality of interconnects are located outside of the display area.

9. The electronic device of claim 7, wherein the plurality of interconnects are located directly behind the display area.

10. The electronic device of claim 7, further comprising a driver integrated circuit (IC) chip on the first side of the substrate and in electrical connection with the first wiring layer.

11. The electronic device of claim 10, wherein the substrate is a multi-layer substrate.

12. The electronic device of claim 10, wherein the substrate is a single layer substrate.

13. The electronic device of claim 1, further comprising a driver IC chip on the first side of the substrate and in electrical connection with the first wiring layer.

14. The electronic device of claim 13, wherein the second wiring layer is electrically connected with the driver IC chip through one or more of the plurality of interconnects extending through the substrate from the first side to the second side.

15. The electronic device of claim 14, further comprising a timing controller chip electrically connected with the second wiring layer.

16. The electronic device of claim 15, wherein the array of LEDs is located in a display area of the display substrate, and the plurality of interconnects are located outside of the display area.

17. The electronic device of claim 2, further comprising an electrically conductive top contact layer on and in electrical contact with the array of LEDs and one or more of the plurality of interconnects.

18. The electronic device of claim 17, further comprising a top encapsulation layer over the top contact layer.

* * * * *